United States Patent
Kumura et al.

(10) Patent No.: US 7,763,920 B2
(45) Date of Patent: Jul. 27, 2010

(54) SEMICONDUCTOR MEMORY HAVING FERROELECTRIC CAPACITOR

(75) Inventors: Yoshinori Kumura, Yokohama (JP); Tohru Ozaki, Tokyo (JP); Iwao Kunishima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 11/898,297

(22) Filed: Sep. 11, 2007

(65) Prior Publication Data
US 2008/0061335 A1    Mar. 13, 2008

(30) Foreign Application Priority Data
Sep. 13, 2006   (JP)  .......................... P2006-248459

(51) Int. Cl.
| | | |
|---|---|---|
| H01L 27/108 | (2006.01) | |
| H01L 29/76 | (2006.01) | |
| H01L 29/94 | (2006.01) | |
| H01L 31/119 | (2006.01) | |
| H01L 31/062 | (2006.01) | |
| H01L 31/113 | (2006.01) | |

(52) U.S. Cl. .................. 257/296; 257/295; 257/298; 257/300; 257/310; 257/E27.034; 257/E27.048; 257/E27.071

(58) Field of Classification Search ......... 257/295–296, 257/300, 310, E27.034, E27.048, E27.071, 257/298
See application file for complete search history.

(56) References Cited

U.S. PATENT DOCUMENTS

| | | | | |
|---|---|---|---|---|
| 5,903,492 | A | | 5/1999 | Takashima |
| 6,611,015 | B2 | * | 8/2003 | Ozaki et al. .................. 257/296 |
| 6,617,628 | B2 | * | 9/2003 | Kim ........................... 257/295 |
| 6,720,598 | B1 | * | 4/2004 | Wohlfahrt .................... 257/295 |
| 6,724,026 | B2 | * | 4/2004 | Jacob et al. .................. 257/295 |
| 6,940,114 | B2 | * | 9/2005 | Oh et al. ...................... 257/296 |
| 7,095,068 | B2 | * | 8/2006 | Kumura et al. ............... 257/295 |
| 7,161,202 | B2 | * | 1/2007 | Hoya et al. ................... 257/296 |
| 7,176,509 | B2 | * | 2/2007 | Maruyama et al. .......... 257/295 |
| 2002/0000585 | A1 | * | 1/2002 | Ozaki .......................... 257/295 |
| 2002/0063271 | A1 | * | 5/2002 | Kim ............................ 257/295 |
| 2002/0072223 | A1 | * | 6/2002 | Gilbert et al. ............... 438/629 |
| 2003/0234411 | A1 | * | 12/2003 | Kanaya et al. ............... 257/295 |

(Continued)

OTHER PUBLICATIONS

Moise et al. "Demonstration of a 4Mb, High Density Ferroelectric Memory Embedded Within A 130nm, 5LM Cu/FSG Logic Process"; IEDM, pp. 535-538, (2002).

*Primary Examiner*—Ida M Soward
(74) *Attorney, Agent, or Firm*—Finnegan, Henderson, Farabow, Garrett & Dunner, L.L.P.

(57) ABSTRACT

According to an aspect of the present invention, there is provided a semiconductor memory including a lower electrode, a first insulating region formed in the same layer as the lower electrode, a ferroelectric film formed on the lower electrode and on the first insulating region, an upper electrode formed on the ferroelectric film, a second insulating region formed in the same layer as the upper electrode and a transistor. The first insulating region partitions the lower electrode. The second insulating region partitions the upper electrode. The transistor includes a first impurity region connected to the lower electrode and a second impurity region connected to the upper electrode. At least one of the first insulating region and the second insulating region is formed by insulating the lower electrode or the upper electrode.

10 Claims, 30 Drawing Sheets

U.S. PATENT DOCUMENTS

| | | | |
|---|---|---|---|
| 2005/0001251 A1* | 1/2005 | Itokawa et al. | 257/296 |
| 2005/0110062 A1* | 5/2005 | Natori et al. | 257/295 |
| 2005/0274999 A1* | 12/2005 | Itokawa et al. | 257/295 |
| 2005/0280059 A1* | 12/2005 | Takano | 257/295 |
| 2006/0022241 A1* | 2/2006 | Shimojo et al. | 257/296 |
| 2006/0108621 A1* | 5/2006 | Hayashi et al. | 257/295 |
| 2007/0170484 A1* | 7/2007 | Horii | 257/296 |
| 2008/0017902 A1* | 1/2008 | Wang | 257/295 |
| 2008/0248595 A1* | 10/2008 | Matsumoto et al. | 438/3 |

* cited by examiner

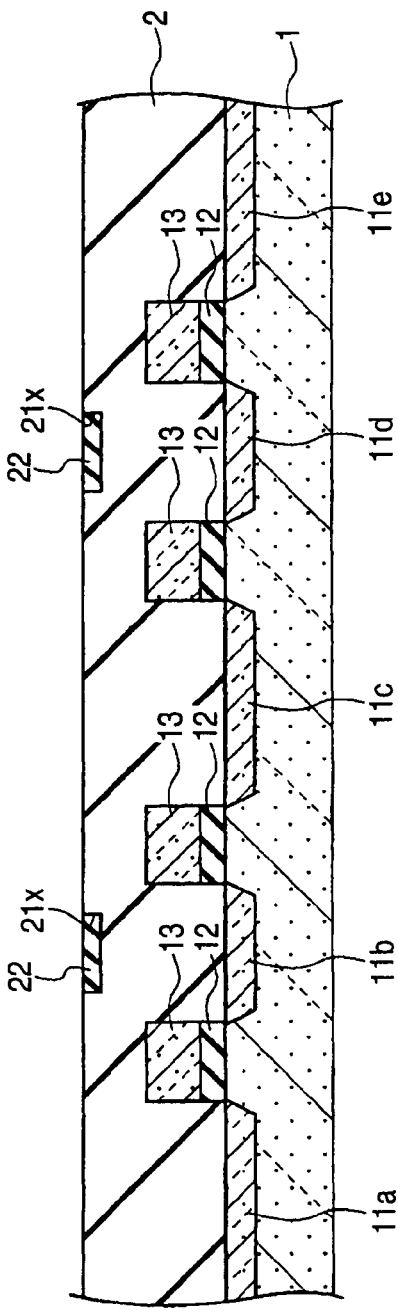
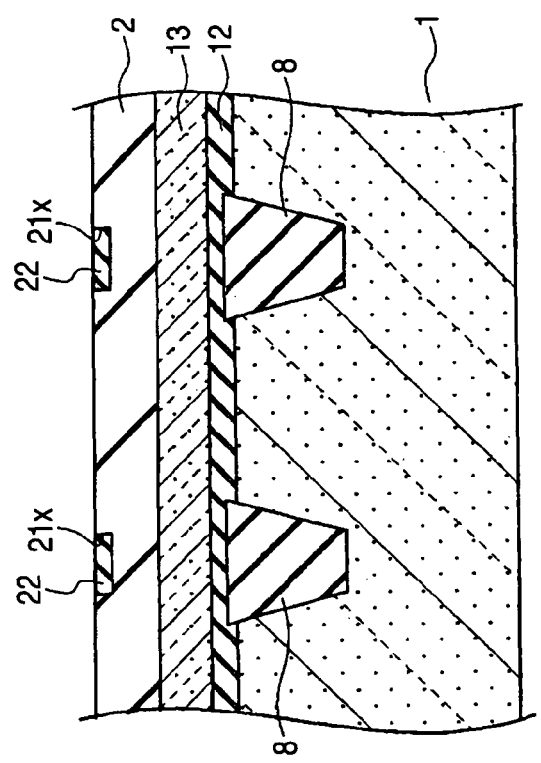

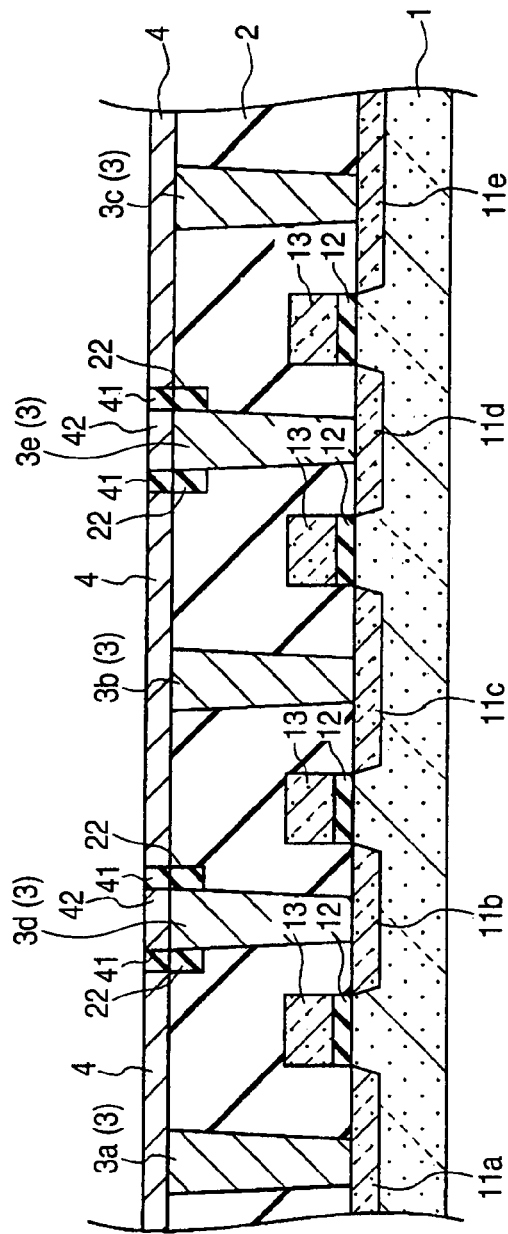
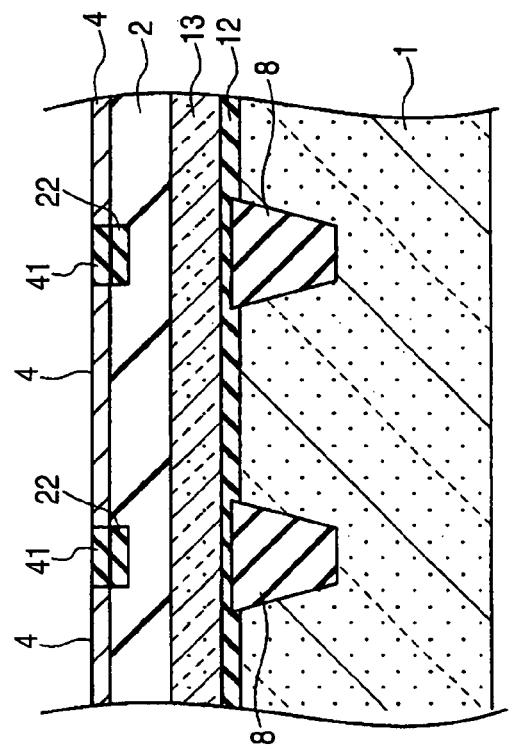
FIG. 9A
FIG. 9B

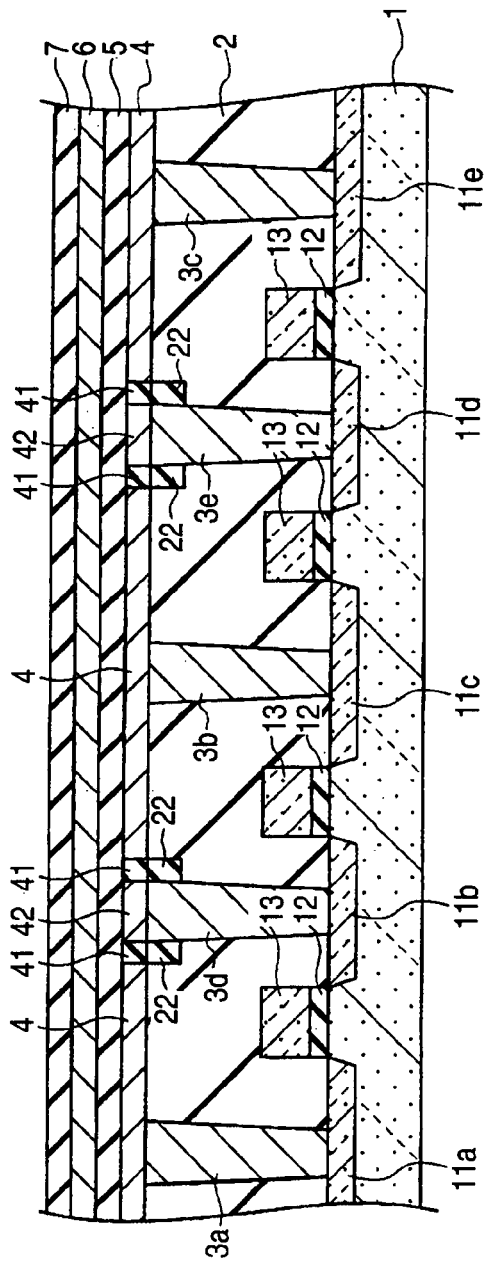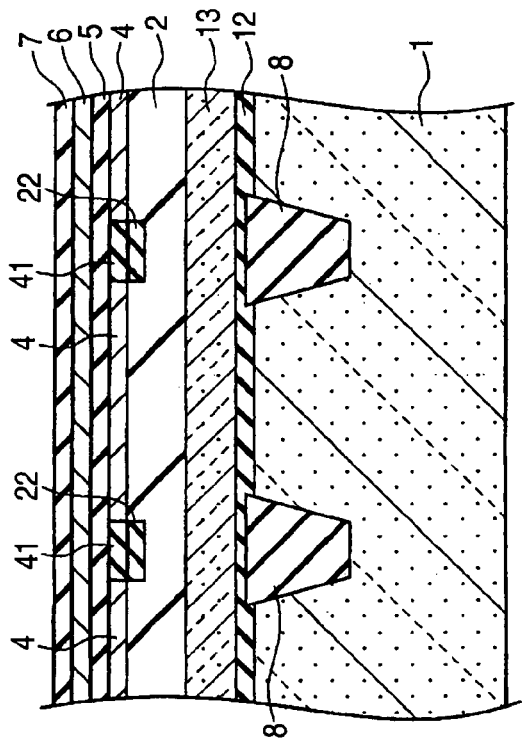
FIG. 10A
FIG. 10B

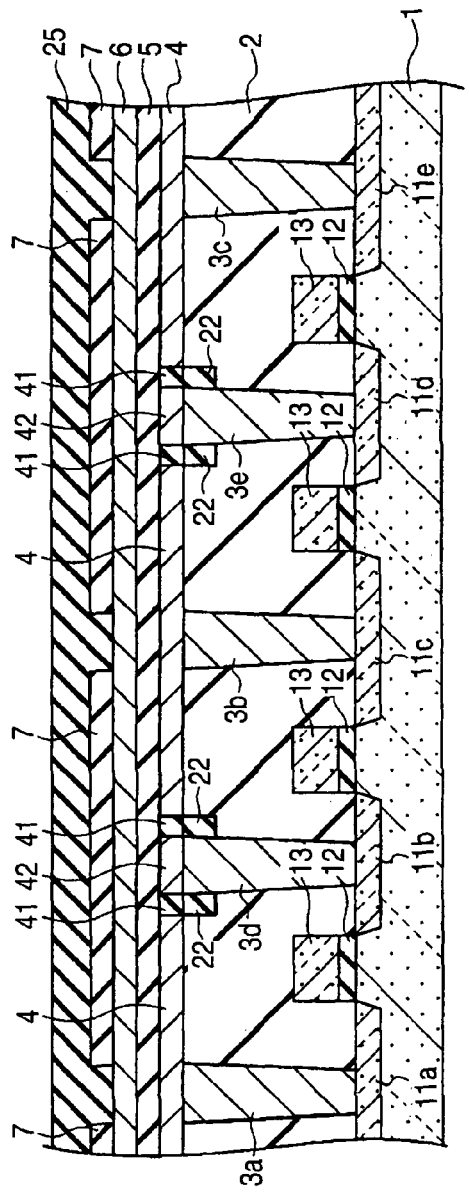
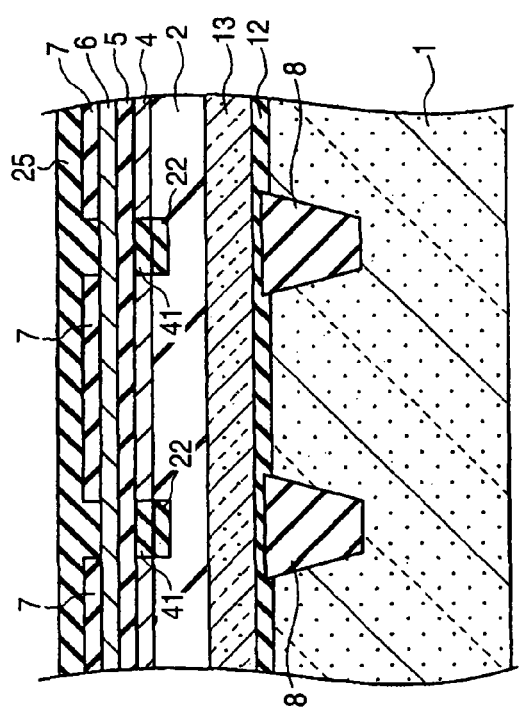
FIG. 12A
FIG. 12B

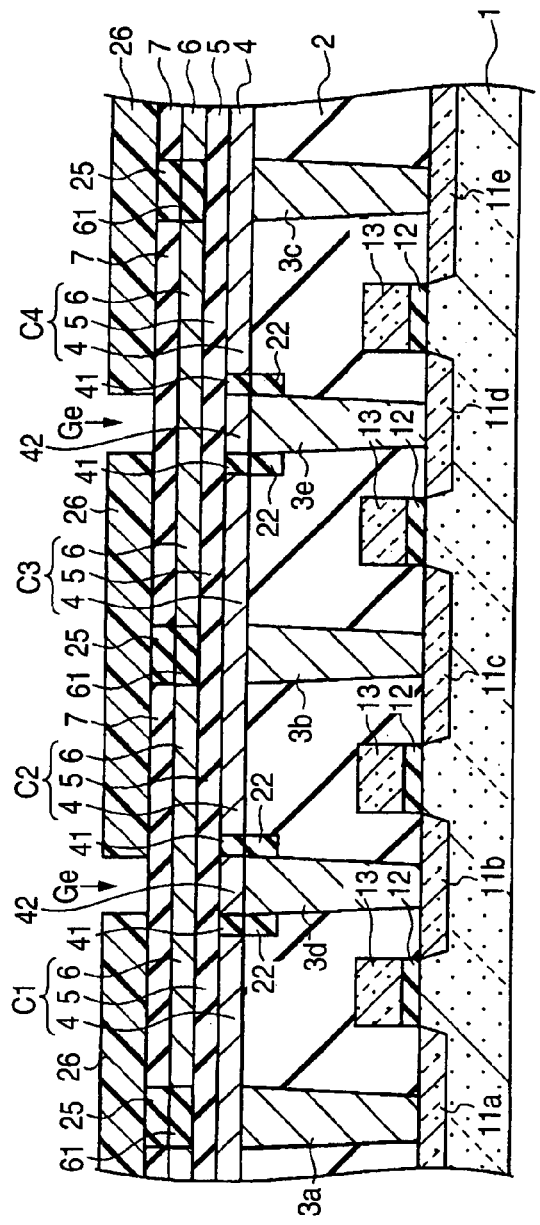
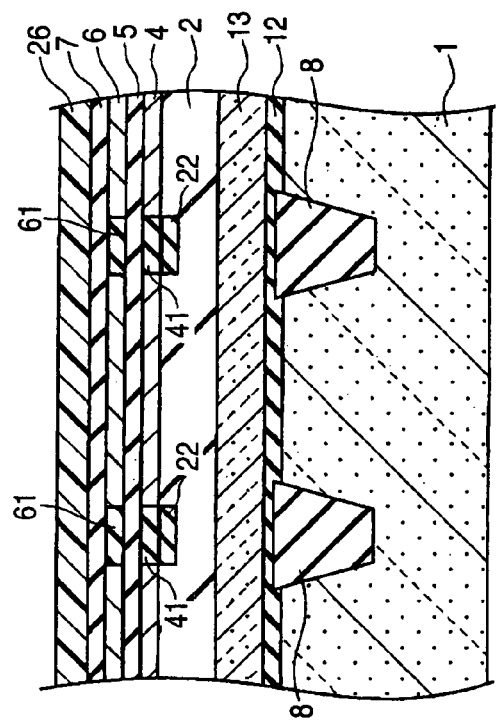
FIG. 14A
FIG. 14B

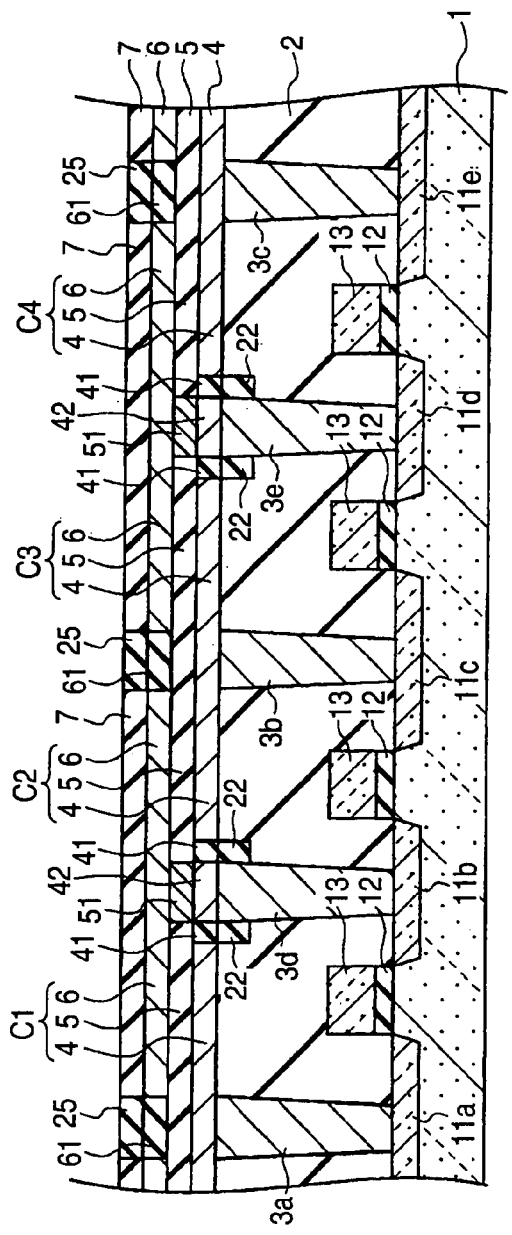
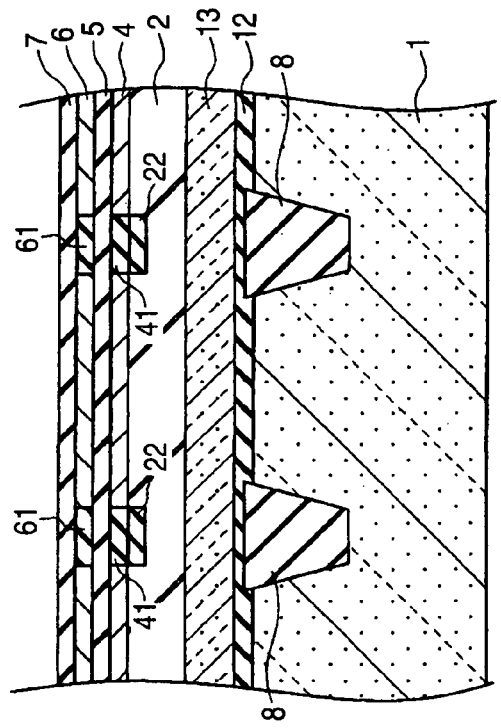
FIG. 15A
FIG. 15B

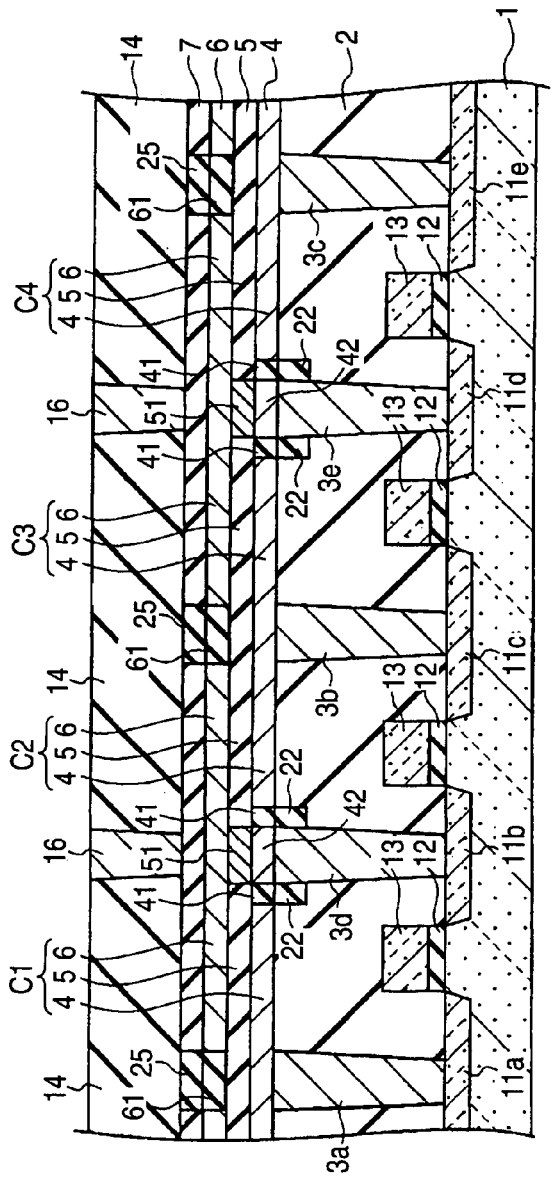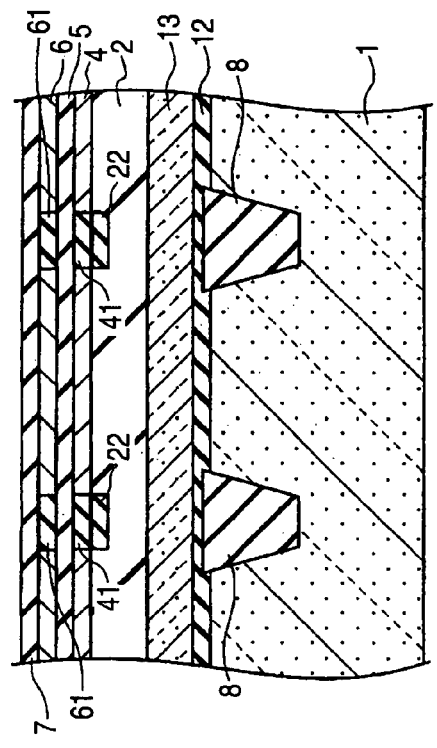
FIG. 16A
FIG. 16B

SEMICONDUCTOR MEMORY HAVING FERROELECTRIC CAPACITOR

CROSS-REFERENCE TO RELATED APPLICATIONS

The entire disclosure of Japanese Patent Application No. 2006-248459 filed on Sep. 13, 2006 including specification, claims, drawings and abstract is incorporated herein by reference in its entirety.

BACKGROUND OF THE INVENTION

1. Field of the Invention

An aspect of the present invention relates to a semiconductor memory using a ferroelectric capacitor and a method for manufacturing the semiconductor memory.

2. Description of the Related Art

A ferroelectric memory using a ferroelectric capacitor is one of semiconductor memories. In a conventional process for forming the ferroelectric capacitor, a lower electrode layer, a ferroelectric film and an upper electrode layer are deposited, and the upper electrode layer, the ferroelectric film and the lower electrode layer are sequentially processed by reactive ion etching (RIE) to form the ferroelectric capacitor (for example, see T. S. Moise et al., "Demonstration of a 4 Mb, high density ferroelectric memory embedded within a 130 nm, 5 LM Cu/FSG logic process", (U.S.A.), International Electron Devices Meeting, 2002, p. 535-538.). However, it is hard to vertically process sidewalls of the upper electrode layer, the ferroelectric film and the lower electrode layer by the RIE. In some cases, moreover, a fence is formed when the sidewalls are vertically processed. For this reason, an RIE converting difference for preventing the formation of the fence is required. When the upper electrode layer, the ferroelectric film and the lower electrode layer are processed by taking into account the RIE converting difference, an interval between ferroelectric capacitors which are adjacent to each other is enlarged. Therefore, for an equal cell size, it is hard to increase an area of the capacitor sequentially processed by the RIE.

SUMMARY OF THE INVENTION

According to an aspect of the present invention, there is provided a semiconductor memory including: a lower electrode; a first insulating region that is formed in the same layer as the lower electrode and that partitions the lower electrode; a ferroelectric film that is formed on the lower electrode and on the first insulating region; an upper electrode formed on the ferroelectric film; a second insulating region that is formed in the same layer as the upper electrode and that partitions the upper electrode; and a transistor including: a first impurity region connected to the lower electrode, a second impurity region connected to the upper electrode, and a channel region disposed between the first impurity region and the second impurity region; wherein at least one of the first insulating region and the second insulating region is formed by insulating the lower electrode or the upper electrode.

According to another aspect of the present invention, there is provided a method for manufacturing a semiconductor memory, including: forming a transistor on a semiconductor substrate; forming an interlayer insulating film on the transistor; forming a lower electrode layer on the interlayer insulating film; performing a first insulation process on a part of the lower electrode layer; forming a ferroelectric layer on the lower electrode layer; forming an upper electrode layer on the ferroelectric layer; and performing a second insulation process on a part of the upper electrode layer; wherein the first insulation process is performed before performing the second insulation process.

BRIEF DESCRIPTION OF THE DRAWINGS

Embodiment may be described in detail with reference to the accompanying drawings, in which:

FIG. 8A is a sectional view showing a subsequent step to FIG. 7A, illustrating the method for manufacturing the semiconductor memory according to the embodiment, and FIG. 8B is a sectional view showing a subsequent step to FIG. 7B, illustrating the method for manufacturing the semiconductor memory according to the embodiment;

FIG. 9A is a sectional view showing a subsequent step to FIG. 8A, illustrating the method for manufacturing the semiconductor memory according to the embodiment, and FIG. 9B is a sectional view showing a subsequent step to FIG. 8B, illustrating the method for manufacturing the semiconductor memory according to the embodiment;

FIG. 10A is a sectional view showing a subsequent step to FIG. 9A, illustrating the method for manufacturing the semiconductor memory according to the embodiment, and FIG. 10B is a sectional view showing a subsequent step to FIG. 9B, illustrating the method for manufacturing the semiconductor memory according to the embodiment;

FIG. 12A is a sectional view showing a subsequent step to FIG. 11A, illustrating the method for manufacturing the semiconductor memory according to the embodiment, and FIG. 12B is a sectional view showing a subsequent step to FIG. 11B, illustrating the method for manufacturing the semiconductor memory according to the embodiment;

FIG. 14A is a sectional view showing a subsequent step to FIG. 13A, illustrating the method for manufacturing the semiconductor memory according to the embodiment, and FIG. 14B is a sectional view showing a subsequent step to FIG. 13B, illustrating the method for manufacturing the semiconductor memory according to the embodiment;

FIG. 15A is a sectional view showing a subsequent step to FIG. 14A, illustrating the method for manufacturing the semiconductor memory according to the embodiment, and FIG. 15B is a sectional view showing a subsequent step to FIG. 14B, illustrating the method for manufacturing the semiconductor memory according to the embodiment;

FIG. 16A is a sectional view showing a subsequent step to FIG. 15A, illustrating the method for manufacturing the semiconductor memory according to the embodiment, and FIG. 16B is a sectional view showing a subsequent step to FIG. 15B, illustrating the method for manufacturing the semiconductor memory according to the embodiment;

DETAILED DESCRIPTION OF THE INVENTION

Figure 1:
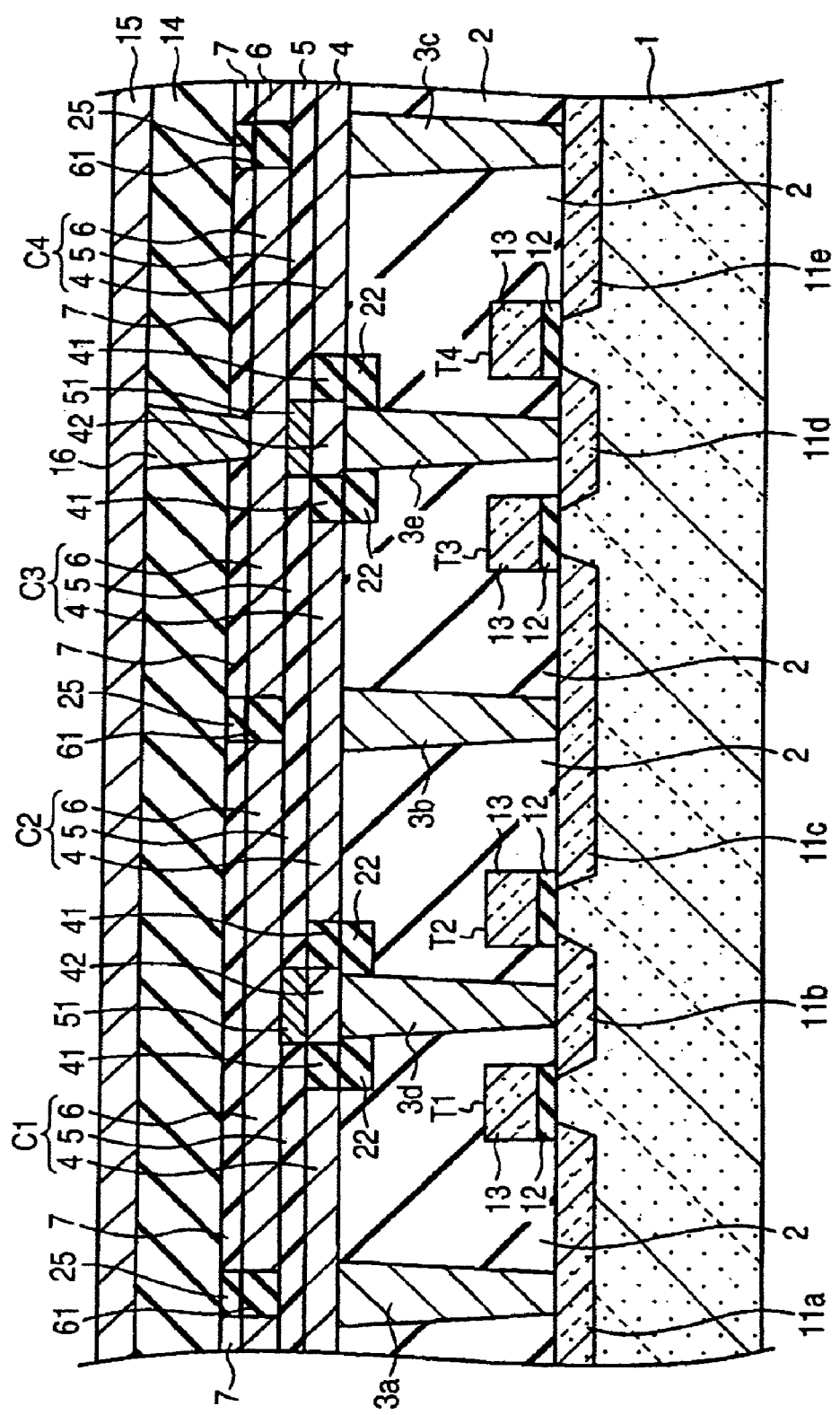
FIG. 1 is a sectional view showing an example of a semiconductor memory according to an embodiment.

An embodiment according to the invention will be described with reference to the drawings. In the following description for the drawings, the same or similar portions have the same or similar reference numerals. However, it is necessary to pay attention to the fact that the drawings are typical and a relationship between a thickness and a planar dimension and a ratio of thicknesses of respective layers are different from actual ones. Accordingly, specific thicknesses and dimensions are to be decided in consideration of the following description. Moreover, it is a matter of course that portions having a different relationship and ratio of respective dimensions are included in the mutual drawings.

In the embodiment according to the invention which will be described below, an apparatus and a method which serve to materialize the technical thought of the invention are shown. The technical thought of the invention does not specify a material, a shape, a structure and an arrangement of a component to the following. The technical thought of the invention can be variously changed within the claims.

As a semiconductor memory according to the embodiment, description will be given to a 1-transistor 1-capacitor (1T1C) type ferroelectric memory, in which one memory cell includes one transistor and one ferroelectric capacitor.

As shown in FIG. 1, the semiconductor memory according to the embodiment includes a lower electrode 4, a first insulating region 41 formed on the same layer as the lower electrode 4 and partitioning the lower electrode 4, a ferroelectric film 5 formed on the lower electrode 4 and the first insulating region 41, an upper electrode 6 formed on the ferroelectric film 5, a second insulating region 61 formed on the same layer as the upper electrode 6 and partitioning the upper electrode 6, and first to fourth transistors T1, T2, T3 and T4 having first impurity regions (source and drain regions) 11a, 11c and 11e connected to the lower electrode 4 and second impurity regions (source and drain regions) 11b and 11d connected to the upper electrode 6 which interpose channel regions therebetween. Although the first to fourth transistors T1 to T4 are typically shown in FIG. 1, they are only illustrative and a predetermined number of transistors in accordance with a density of a ferroelectric memory are present.

Each of the first to fourth transistors T1 to T4 which are typically illustrated is an MOS transistor. The first to fourth transistors T1 to T4 share the source and drain regions 11a to 11e to be the impurity regions which are provided on an upper part of a semiconductor substrate 1 between the first to fourth transistors T1 to T4 which are adjacent to each other, respectively. "Share" means a common region in which the drain region functions as the source region among the first to fourth transistors T1 to T4 which are adjacent to each other. For example, the drain region 11b of the first transistor T1 acts as the source region 11b of the second transistor T2 which is adjacent thereto.

The first transistor T1 includes the source region 11a, the drain region 11b, and a gate electrode 13 disposed through a gate insulating film 12 on the channel region interposed between the source region 11a and the drain region 11b. The second transistor T2 includes the source region 11b, the drain region 11c, and the gate electrode 13 disposed through the gate insulating film 12 on the channel region interposed between the source region 11b and the drain region 11c. The third transistor T3 includes the source region 11c, the drain region 11d, and the gate electrode 13 disposed through the gate insulating film 12 on the channel region interposed between the source region 11c and the drain region 11d. The fourth transistor T4 includes the source region 11d, the drain region 11e, and the gate electrode 13 disposed through the gate insulating film 12 on the channel region interposed between the source region 11d and the drain region 11e. Other transistors (not shown) have the same structure.

For a material of the semiconductor substrate 1, it is possible to use n-type silicon (Si). In place of the semiconductor substrate 1, it is also possible to use an n-type well formed on an upper part of a p-type semiconductor substrate. For a material of the gate insulating film 12, it is also possible to use silicon oxide ($SiO_2$), silicon nitride ($Si_3N_4$), tantalum oxide ($Ta_2O_5$), titanium oxide ($TiO_2$), alumina ($Al_2O_3$) and zirconium oxide ($ZrO_2$). For a material of the gate electrode 13, it is possible to use polysilicon. A silicide electrode may be disposed on the source and drain regions 11a to 11e and the gate electrode 13. Moreover, a sidewall insulating film may be disposed on a sidewall of the gate electrode 13.

An interlayer insulating film 2 is disposed on the semiconductor substrate 1 and the gate electrode 13. For a material of the interlayer insulating film 2, it is possible to use boron phosphorus silicate glass (BPSG), plasma tetraethoxysilane (P-TEOS) or ozone-tetraethoxysilane ($O_3$-TEOS), for example.

First to fourth ferroelectric capacitors C1 to C4 are defined by the lower electrode 4, the ferroelectric film 5 and the upper electrode 6. The first insulating region 41 is formed on the same layer as the lower electrode 4 and partitions the lower electrode 4. The second insulating region 61 is formed on the same layer as the upper electrode 6 and partitions the upper electrode 6. Each of the first to fourth ferroelectric capacitors C1 to C4 constitutes a memory cell together with each of the first to fourth transistors T1 to T4. Although only the first to fourth ferroelectric capacitors C1 to C4 are shown in FIG. 1, they are illustrative in the same manner as the first to fourth transistors T1 to T4 and the number thereof is not particularly restricted.

Each of the first to fourth ferroelectric capacitors C1 to C4 shares either the upper electrode 6 or the lower electrode 4 with the adjacent ferroelectric capacitor. In other words, the first and second ferroelectric capacitors C1 and C2 which are adjacent to each other share the upper electrode 6. On the other hand, the lower electrodes 4 of the first and second ferroelectric capacitors C1 and C2 are insulated from each other through the first insulating region 41. Moreover, the second and third ferroelectric capacitors C2 and C3 which are adjacent to each other share the lower electrode 4. On the other hand, the upper electrodes 6 of the second and third ferroelectric capacitors C2 and C3 are insulated from each other through the second insulating region 61. Furthermore, the third and fourth ferroelectric capacitors C3 and C4 which are adjacent to each other share the upper electrode 6. On the other hand, the lower electrodes 4 of the third and fourth ferroelectric capacitors C3 and C4 are insulated from each other through the first insulating region 41.

A material of each of the lower electrode 4 and the upper electrode 6 contains platinum (Pt), iridium (Ir), iridium oxide ($IrO_2$), strontium ruthenate oxide ($SrRuO_3$), ruthenium (Ru), ruthenium oxide ($RuO_2$) or $La_{1-x}Sr_xVO_3$ (X<0.2), for example. A material of the ferroelectric film 5 contains lead zirconate titanate (PZT) or strontium bismuth tantalate (SBT). The first insulating region 41 contains the material of the lower electrode 4 and insulating species of Ti, Si, aluminum (Al), strontium (Sr) or Cu. The second insulating region 61 contains the material of the upper electrode 6 and the insulating species of Ti, Si, Al, Sr or Cu.

A first conductive region 42 connected to the source and drain regions 11b and 11d respectively is provided in the first insulating region 41. A second conductive region 51 for conducting the first conductive region 42 to the upper electrode 6 is formed in the ferroelectric film 5 provided on the first conductive region 42.

First to fifth contact plugs 3a to 3e to penetrate through the interlayer insulating film 2 are disposed. The first contact plug 3a connects the lower electrode 4 of the first ferroelectric capacitor C1 to the source and drain region 11a. The second contact plug 3b connects the lower electrode 4 of the second and third ferroelectric capacitors C2 and C3 to the source and drain region 11c. The third contact plug 3c connects the lower electrode 4 of the fourth ferroelectric capacitor C4 to the source and drain region 11e. The fourth contact plug 3d connects the upper electrode 6 of the first and second ferroelectric capacitors C1 and C2 to the source and drain region 11b through the second conductive region 51 and the first conductive region 42. The fifth contact plug 3e connects the upper electrode 6 of the third and fourth ferroelectric capacitors C3 and C4 to the source and drain region 11d through the second conductive region 51 and the first conductive region 42. For a material of the first to fifth contact plugs 3a to 3e, it is possible to use tungsten (W), for example.

A hydrogen diffusion preventing film 7 is disposed on the upper electrode 6 of the first to fourth ferroelectric capacitors C1 to C4 and the second insulating region 61. For a material of the hydrogen diffusion preventing film 7, it is possible to use alumina ($Al_2O_3$), silicon nitride (SiN) or titanium oxide ($TiO_2$).

An interlayer insulating film 14 is disposed on the hydrogen diffusion preventing film 7. For a material of the interlayer insulating film 14, it is possible to use P-TEOS, $O_3$-TEOS, spin-on-glass (SOG), or a Low-k film such as silicon oxide fluoride (SIOF) or a carbon added silicon oxide film (SIOC).

A wiring (a bit line) 15 connected to the upper electrode 6 through an upper contact plug 16 is disposed on the interlayer insulating film 14. As a material of the upper contact plug 16, it is possible to use W, aluminum (Al), titanium nitride (TiN), copper (Cu), titanium (Ti), tantalum (Ta) or tantalum nitride (TaN), for example. The wiring 15 is selected from materials containing W, Al, TiN, Cu, Ta or TaN, for example.

Figure 2:
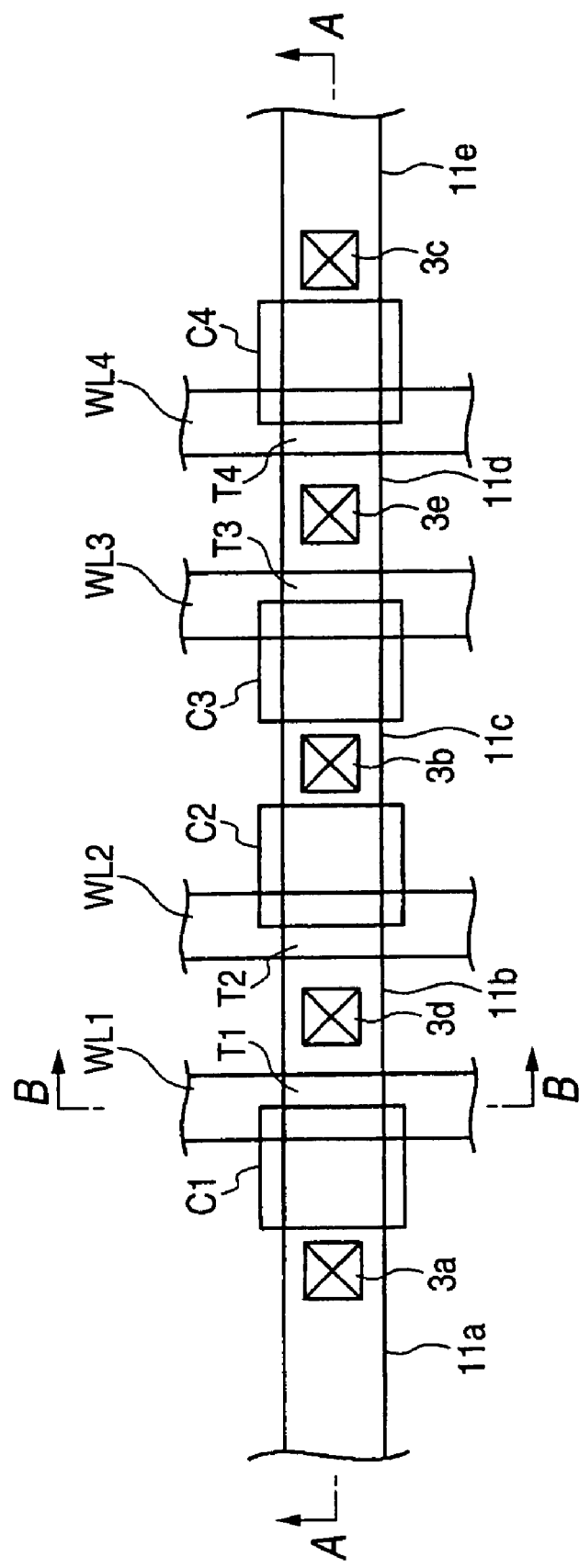
FIG. 2 is a plan view showing an example of the semiconductor memory according to the embodiment.
Figure 3:
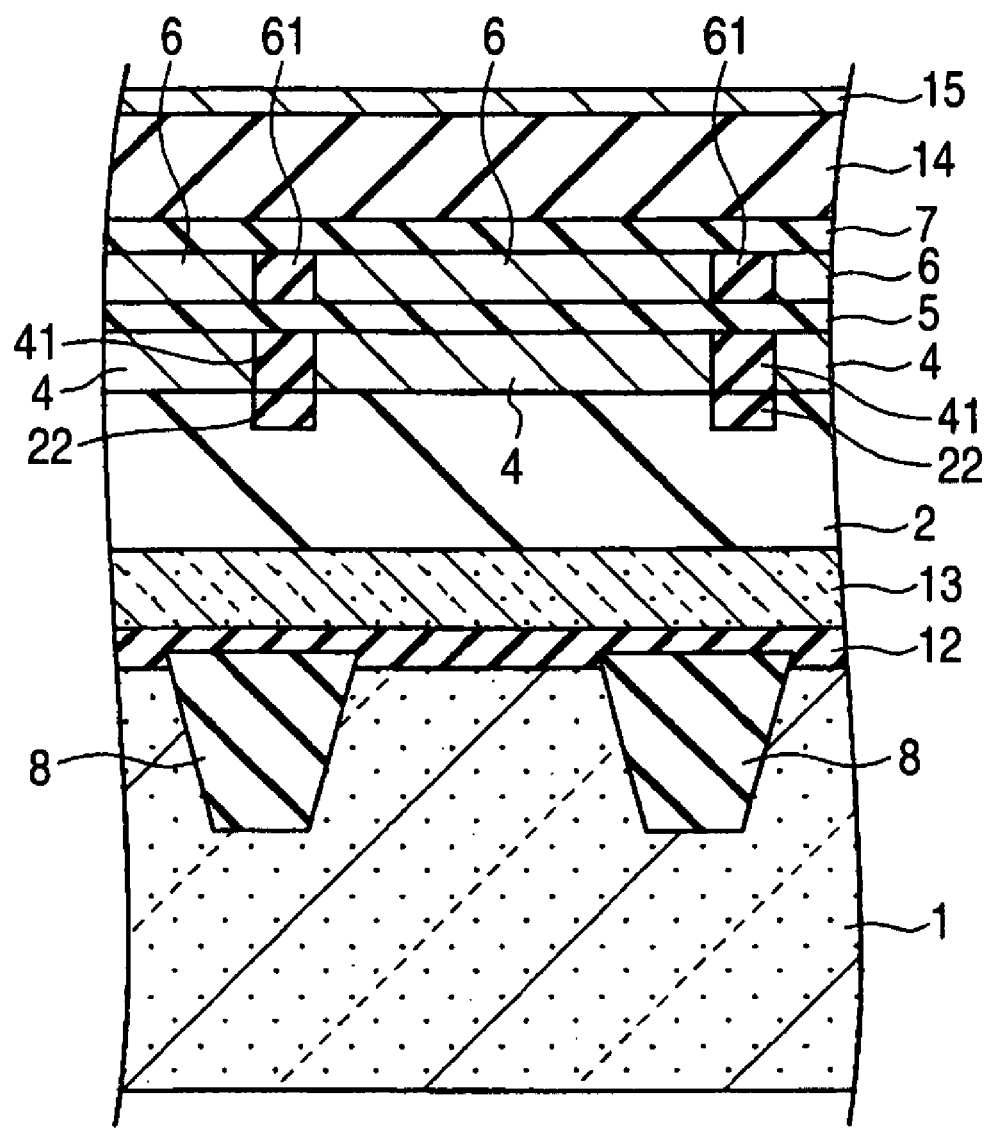
FIG. 3 is a sectional view showing an example of the semiconductor memory according to the embodiment.

FIG. 2 is a plan view showing a part of a cell array of the ferroelectric memory corresponding to the sectional view of FIG. 1 (an A-A cut surface in FIG. 2 has the sectional structure of FIG. 1). As shown in FIG. 2, the gate electrodes 13 of the first to fourth transistors T1 to T4 shown in FIG. 1 are arranged in a plurality of word lines WL1 to WL4. As described with reference to FIG. 1, although a large number of word lines may be arranged and a large number of memory cells may be disposed in the cell array of the ferroelectric memory, which are not shown in FIG. 2. FIG. 3 shows a sectional structure seen from a B-B cut surface in FIG. 2. As shown in FIG. 3, transistors which are adjacent to each other are isolated from each other through an STI region 8 in a direction along the word lines WL1 to WL4.

Figure 4A:
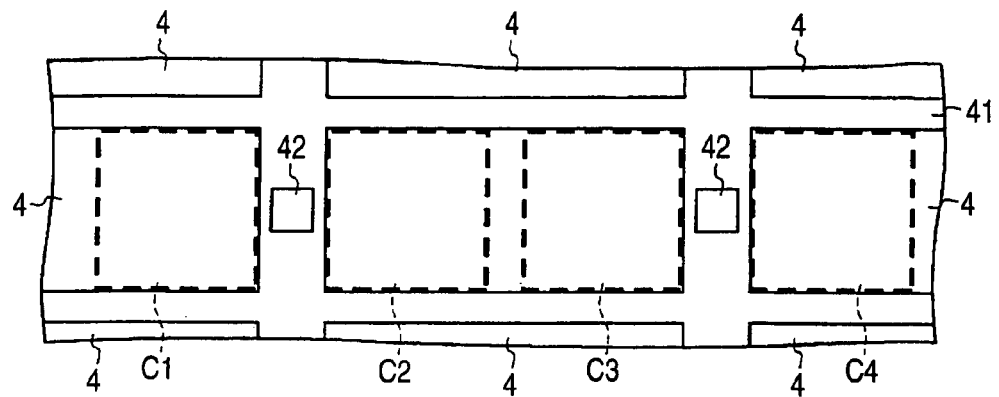
FIG. 4A is a plan view showing an example of a lower electrode of the semiconductor memory according to the embodiment.
Figure 4B:
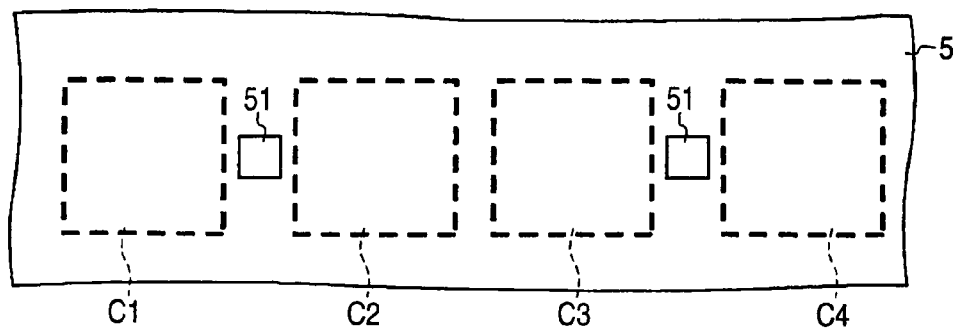
FIG. 4B is a plan view showing an example of a ferroelectric film of the semiconductor memory according to the embodiment.
Figure 4C:
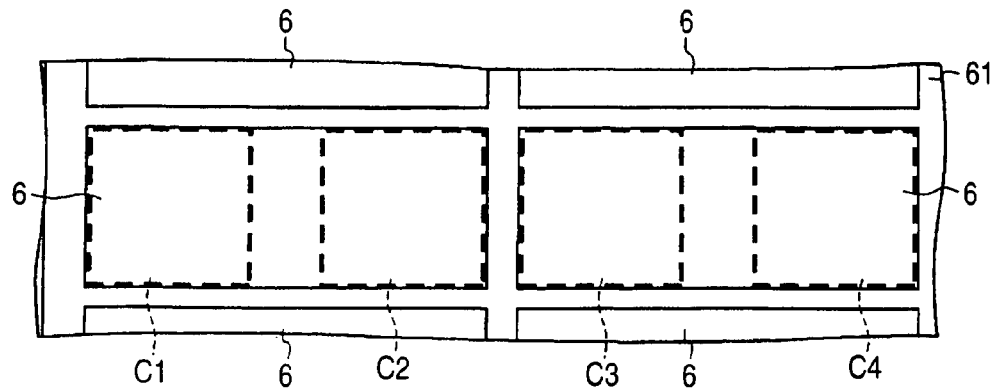
FIG. 4C is a plan view showing an example of an upper electrode of the semiconductor memory according to the embodiment.

As shown in FIG. 4A, the lower electrode 4 of the first ferroelectric capacitor C1, the lower electrode 4 of the second and third ferroelectric capacitors C2 and C3, and the lower electrode 4 of the fourth ferroelectric capacitor C4 are insulated from each other by the first insulating region 41. As shown in FIG. 4B, the second conductive region 51 is provided in the ferroelectric film 5 between the first and second ferroelectric capacitors C1 and C2 and the ferroelectric film 5 between the third and fourth ferroelectric capacitors C3 and C4. As shown in FIG. 4C, the upper electrode 6 of the first and second ferroelectric capacitors C1 and C2 and the upper electrode 6 of the third and fourth ferroelectric capacitors C3 and C4 are insulated from each other by the second insulating region 61.

Figure 5:
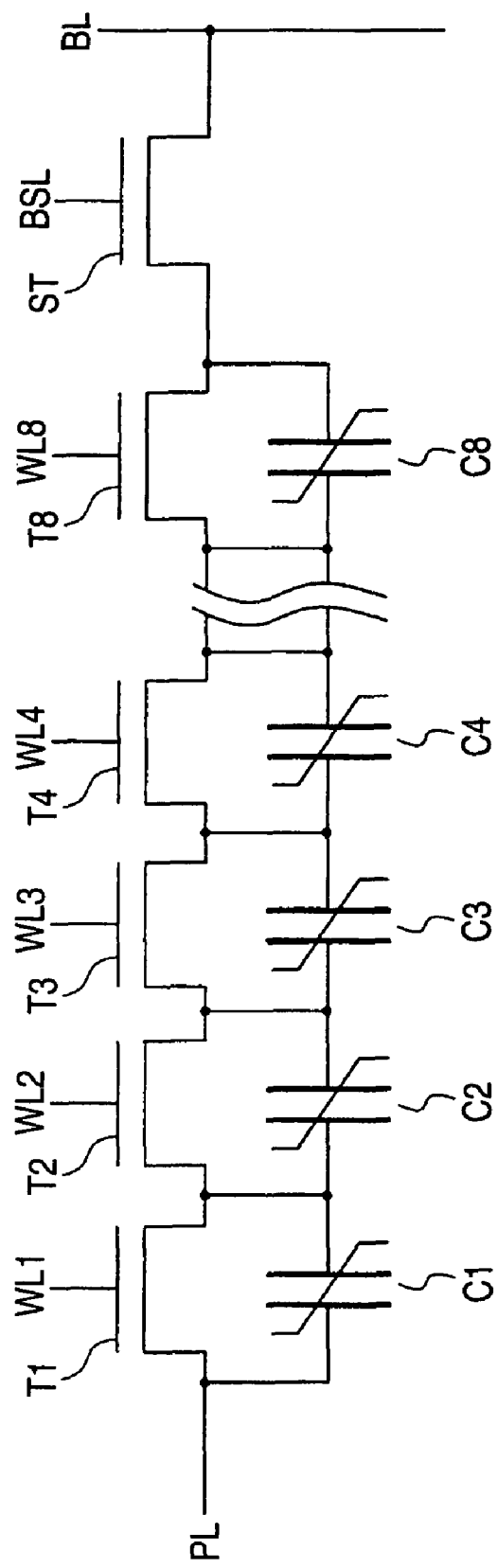
FIG. 5 is a circuit diagram showing the semiconductor memory according to the embodiment.

As shown in FIG. 5, both ends of each of the first to eighth ferroelectric capacitors C1 to C8 are connected between a source and a drain of each of the first to eighth transistors T1 to T8 to form a unit cell. A plurality of unit cells is connected in series on a unit of a block which will be referred to as a "TC parallel unit series connection type ferroelectric memory". The number of the series connections is not restricted to eight. A plate line PL is connected to the source of the first transistor T1 on one of ends of the block. On the other end of the block, one of ends of a selecting transistor ST is connected to the drain of the eighth transistor T8. The selecting transistor ST has a gate to which a block selecting BSL is connected. The other end of the selecting transistor ST is connected to a bit line BL.

As shown in FIG. 1, the first and second ferroelectric capacitors C1 and C2 which are adjacent to each other share the upper electrode 6, the second and third ferroelectric capacitors C2 and C3 which are adjacent to each other share the lower electrode 4, and the third and fourth ferroelectric capacitors C3 and C4 which are adjacent to each other share the upper electrode 6. Therefore, the first to fourth ferroelectric capacitors C1 to C4 can be arranged minutely on the same layer. Accordingly, it is possible to increase the area of the capacitor for an equal cell size.

Furthermore, the upper electrode 6 of each of the first and second ferroelectric capacitors C1 and C2, and the upper electrode 6 of each of the third and fourth ferroelectric capacitors C3 and C4 are connected to each other on the same horizontal level. As compared with the case in which the upper electrodes 6 are connected to each other through a contact plug or a wiring to be an upper layer of the upper electrode 6, therefore, it is possible to reduce the number of the contact plugs and that of the wirings.

In addition, the fourth contact plug 3d is commonly used for the upper electrode 6 shared by the first and second ferroelectric capacitors C1 and C2, and the fifth contact plug 3e is commonly used for the upper electrode 6 shared by the third and fourth ferroelectric capacitors C3 and C4, respectively, and the number of the contact plugs can be reduced. Moreover, the second contact plug 3b is commonly used for the lower electrode 4 shared by the second and third ferroelectric capacitors C2 and C3, and the number of the contact plugs can be reduced. Generally, forming of the contact plug may cause a damage. Therefore, it is possible to enhance a ferroelectric characteristic by decreasing the number of the contact plugs.

Figure 6A:
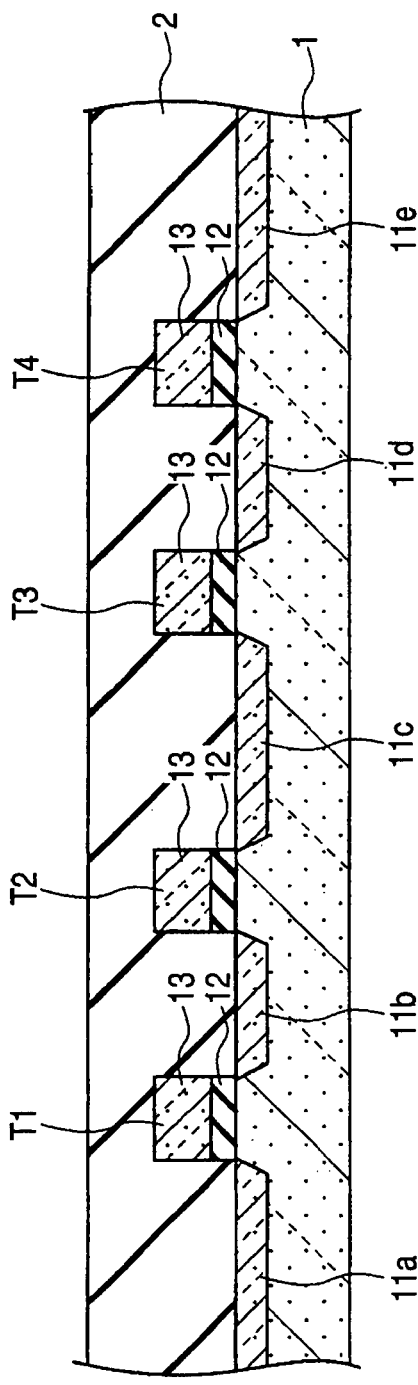
FIG. 6A is a sectional view showing a step, illustrating a method for manufacturing the semiconductor memory according to the embodiment.

Next, description will be given to a method for manufacturing the semiconductor memory according to the embodiment. FIGS. 6A, 7A, . . . , FIG. 16A are sectional views showing steps seen from a cut surface in an A-A direction of FIG. 2, and furthermore, FIGS. 6B, 7B, . . . , FIG. 16B are sectional views showing steps seen from a cut surface in a B-B direction of FIG. 2.

Figure 6B:
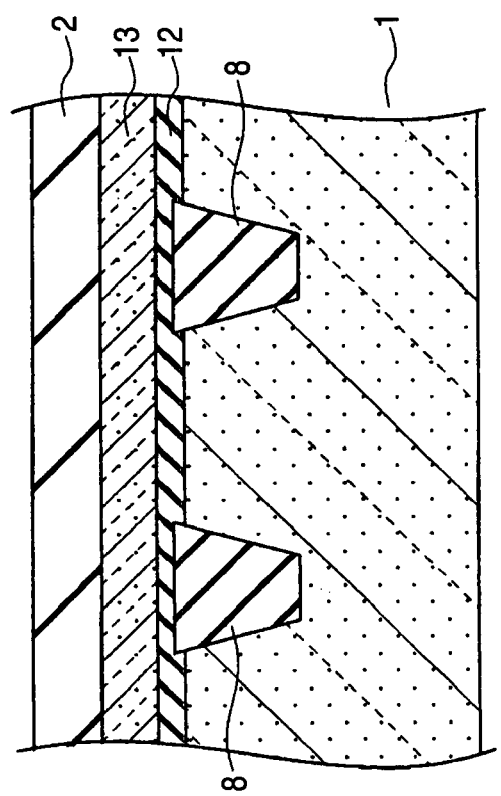
FIG. 6B is a sectional view showing a step, illustrating the method for manufacturing the semiconductor memory according to the embodiment.
Figure 7A:
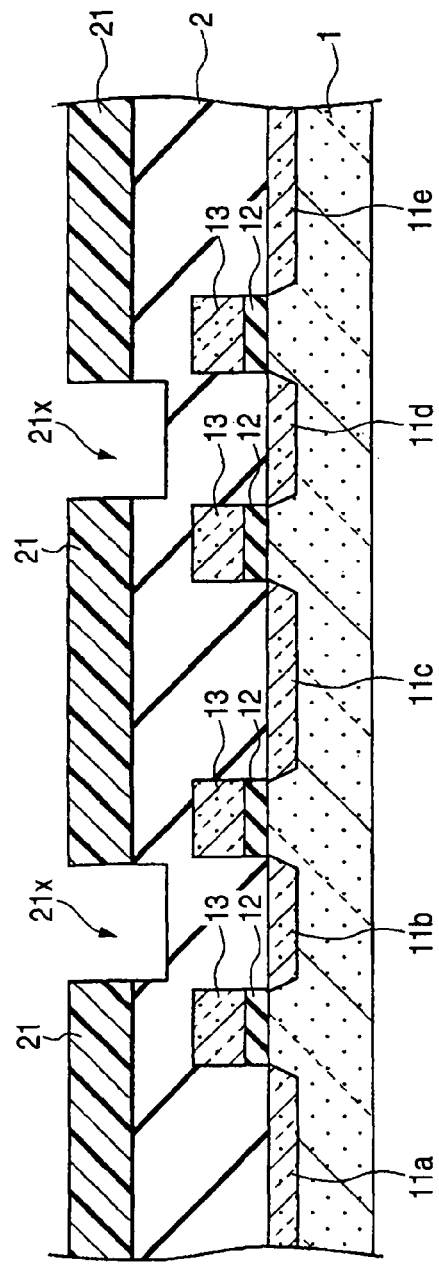
FIG. 7A is a sectional view showing a subsequent step to FIG. 6A, illustrating the method for manufacturing the semiconductor memory according to the embodiment.

(A) As shown in FIGS. 6A and 6B, first to fourth transistors T1 to T4 are formed on a semiconductor substrate 1 such as n-type silicon. The first to fourth transistors T1 to T4 are illustrative and the number is not restricted to four. An interlayer insulating film 2 such as BPSG is deposited on the semiconductor substrate 1 and the first to fourth transistors T1 to T4 by a CVD method, and an upper surface of the interlayer insulating film 2 is flattened by chemical mechanical polishing (CMP).

Figure 7B:
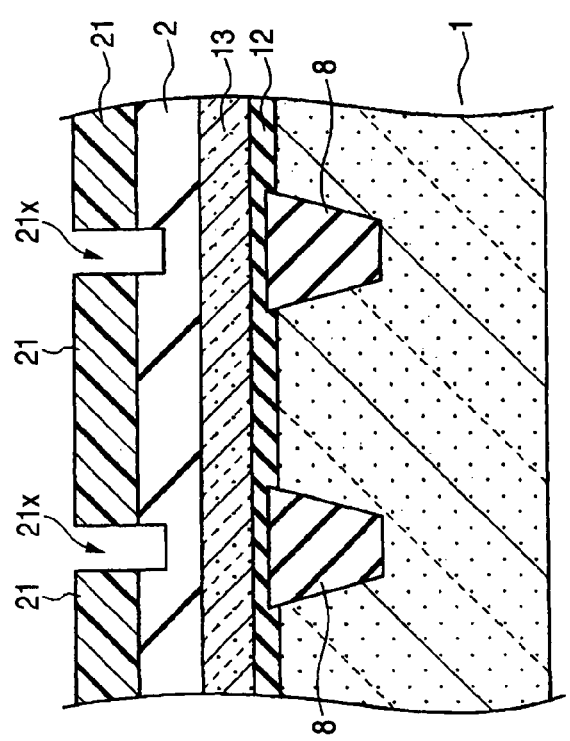
FIG. 7B is a sectional view showing a subsequent step to FIG. 6B, illustrating the method for manufacturing the semiconductor memory according to the embodiment.

(B) Next, a resist film 21 is applied onto the interlayer insulating film 2 and is thus subjected to patterning by using a photolithographic technique. By using, as a mask, the resist film 21 thus patterned, a part of the interlayer insulating film 2 is selectively removed by the RIE. As a result, a trench portion 21x is formed as shown in FIGS. 7A and 7B. The residual resist film 21 is removed by using of a resist remover. A first insulating member 22 is deposited by such as a CVD method. The first insulating member 22 is flattened by a CMP method. As a result, as shown in FIGS. 8A and 8B, the first insulating member 22 is embedded in the trench portion 21x. The first insulating member 22 is selected from materials (insulating species) capable of insulating apart of a lower electrode layer to be deposited in a subsequent procedure, for example, Ti, Si, Al, Sr and Cu.

(C) Then, a resist film is applied onto the interlaying insulating film 2 and the first insulating member 22, and is subjected to patterning by using the photolithographic technique. A part of the interlayer insulating film 2 is selectively removed until the semiconductor substrate 1 is reached by the RIE using the patterned resist film as a mask. The residual resist mask is removed by means of the resist remover. As a result, a contact hole is formed. Then, a metal material 3 such as W is deposited on the contact hole by a vacuum deposition method or sputtering and is flattened. As a result, first to fifth contact plugs 3a to 3e are embedded in the contact hole.

(D) Thereafter, a lower electrode layer 4 is deposited on the first insulating member 22, the interlayer insulating film 2 and the first to fifth contact plugs 3a to 3e. The lower electrode layer 4 is formed by a material including Pt, Ir, $IrO_2$, $SrRuO_3$, Ru, $RuO_2$ or $La_{1-x}Sr_xVO_3$ (X<0.2), for example.

(E) Subsequently, a part of the lower electrode layer 4 provided in contact with the first insulating member 22 is transitioned from the conductor to the insulator. That is, the part of the lower electrode layer 4 is insulated by the insulating species of the first insulating member 22. For example, in the case in which the lower electrode layer 4 is Pt, Ir or $IrO_2$, Ti, Si or Al is selected as the first insulating member 22. Annealing is carried out in an oxygen ($O_2$) atmosphere and Ti, Si or Al of the first insulating member 22 is thus solid-state diffused into the lower electrode layer 4. Then, a rapid heat treatment (RTO) is carried out so that Ti, Si or Al is oxidized. Thus, $TiO_2$, $SiO_2$ or $Al_2O_3$ is formed in the lower electrode layer 4. As a result, as shown in FIGS. 9A and 9B, a first insulating region 41 is formed on the first insulating member 22 so that the lower electrode 4 is separated and a first conductive region 42 is thus formed. In the case in which a material of the lower electrode layer 4 is $SrRuO_3$, Ti is selected as the first insulating member 22. Ti is solid-state diffused into the lower electrode layer 4 so that the first insulating region 41 of strontium ruthenate titanate oxide ($SrRu_xTi_{1-x}O_3$) is formed. In the case in which the material of the lower electrode layer 4 is Ru or $RuO_2$, moreover, Al, Ti or Cu is selected as the first insulating member 22. Al, Ti or Cu is solid-state diffused and is oxidized by a rapid thermal oxidization (RTO). Consequently, $Al_2O_3$, $TiO_x$ or $CuO_x$ is formed in the lower electrode layer 4 so that the first insulating region 41 is formed. In the case in which the material of the lower electrode layer 4 is $La_{1-x}Sr_xVO_3$, moreover, Sr is selected as the first insulating member 22. Sr is solid-state diffused so that a metal insulator transition is caused in the vicinity of a portion in which a value of X is 0.2. Thus, the first insulating region 41 is formed. The value of X is set to be sufficiently greater than 0.2.

(F) As shown in FIGS. 10A and 10B, next, a ferroelectric film 5, an upper electrode layer 6 and a hydrogen diffusion preventing film 7 are deposited on the lower electrode 4 in order by a CVD method. The ferroelectric film 5 is formed by a material including PZT or SBT, for example. The upper electrode layer 6 is formed by a material including Pt, Ir, $IrO_2$, $SrRuO_3$, Ru, $RuO_2$ or $La_{1-x}Sr_xVO_3$ (X<0.2). The hydrogen diffusion preventing film 7 is formed of $Al_2O_3$, for example.

Figure 11A:
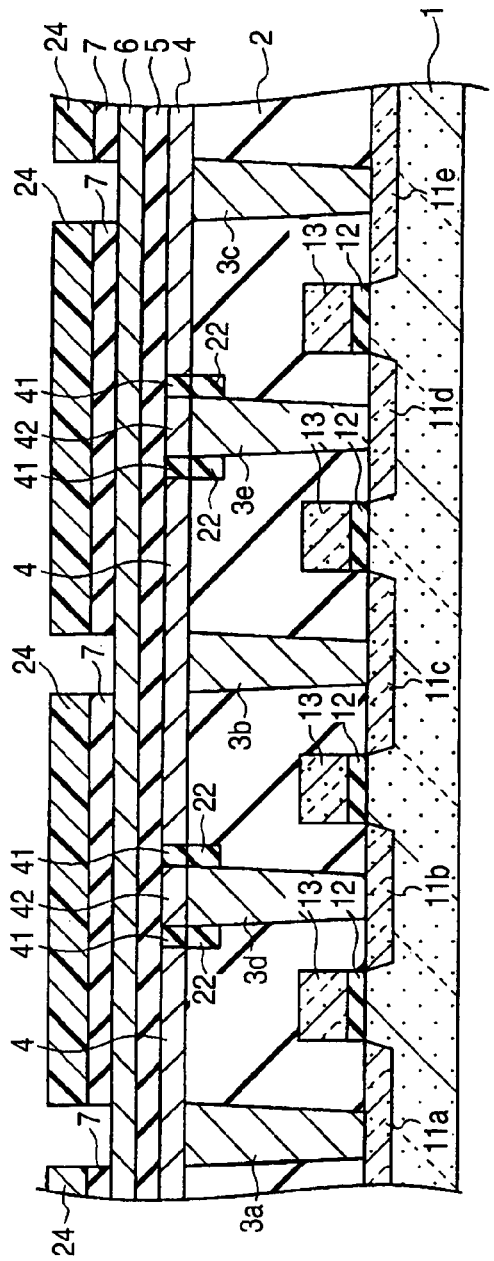
FIG. 11A is a sectional view showing a subsequent step to FIG. 10A, illustrating the method for manufacturing the semiconductor memory according to the embodiment.
Figure 11B:
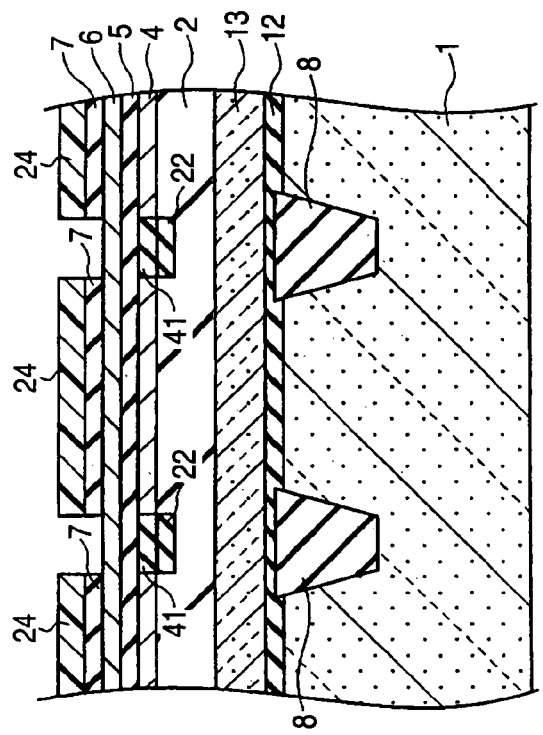
FIG. 11B is a sectional view showing a subsequent step to FIG. 10B, illustrating the method for manufacturing the semiconductor memory according to the embodiment.

(G) Next, a resist film 24 is applied onto the hydrogen diffusion preventing film 7, and is subjected to patterning by using the photolithographic technique. The resist film 24 thus patterned is used as a mask to selectively remove a part of the hydrogen diffusion preventing film 7 by the RIE as shown in FIGS. 11A and 11B. The residual resist film 24 is removed by using of the resist remover.

(H) As shown in FIGS. 12A and 12B, thereafter, a second insulating member 25 is deposited on the hydrogen diffusion preventing film 7 and the part of the upper electrode layer 6 exposed through the opening portion of the hydrogen diffusion preventing film 7 by the CVD method and flattened by the CMP. Thus the second insulating member 25 is embedded in the opening portion of the hydrogen diffusion preventing film 7. The second insulating member 25 is selected from materials (insulating species) capable of insulating a part of the upper electrode layer 6, for example, Ti, Si, Al, Sr and Cu.

Figure 13A:
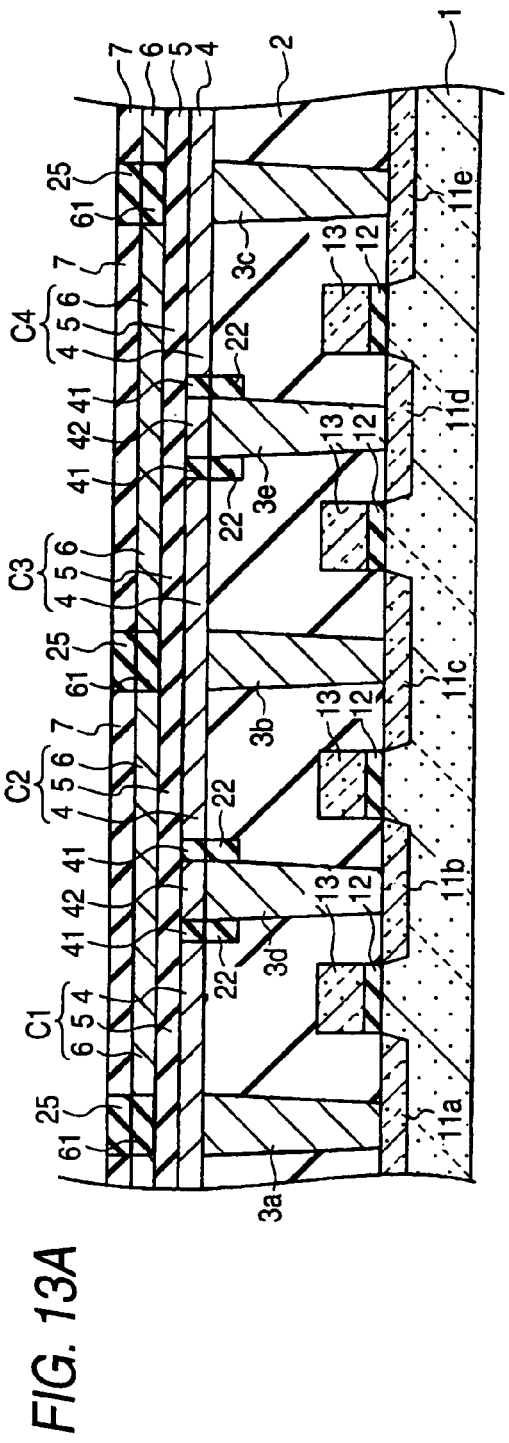
FIG. 13A is a sectional view showing a subsequent step to FIG. 12A, illustrating the method for manufacturing the semiconductor memory according to the embodiment.
Figure 13B:
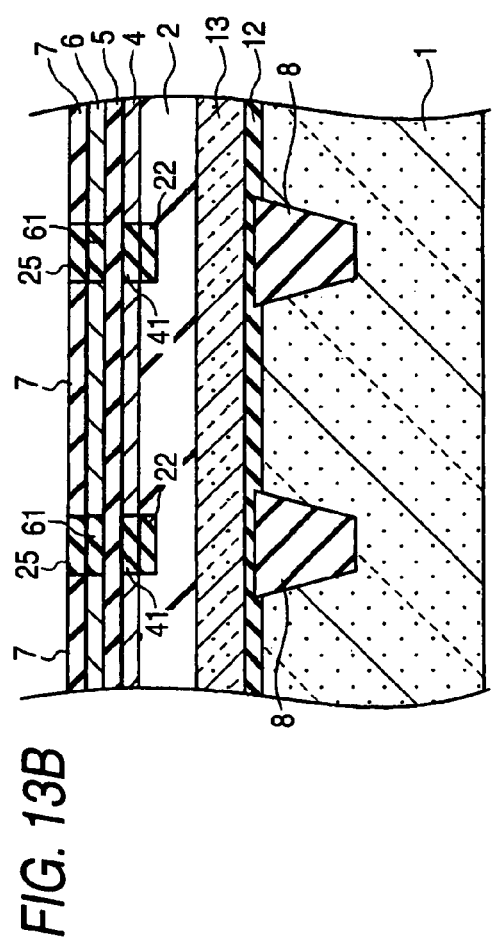
FIG. 13B is a sectional view showing a subsequent step to FIG. 12B, illustrating the method for manufacturing the semiconductor memory according to the embodiment.

(I) Next, a part of the upper electrode layer 6 provided in contact with the second insulating member 25 is reformed and insulated by the insulating species of the second insulating member 25. For example, in the case in which the upper electrode layer 6 is Pt, Ir or $IrO_2$, Ti, Si or Al is selected as the second insulating member 25. The annealing is carried out in the oxygen ($O_2$) atmosphere and Ti, Si or Al is solid-state diffused into the upper electrode layer 6. Then, the RTO is carried out to oxidize Ti, Si or Al so that $TiO_2$, $SiO_2$ or $Al_2O_3$ is formed in the upper electrode layer 6. Thereafter, the unreacted second insulating member 25 provided on the hydrogen diffusion preventing film 7 is removed. As a result, as shown in FIGS. 13A and 13B, a second insulating region 61 is formed so that the upper electrode 6 is separated, and first to fourth ferroelectric capacitors C1 to C4 are formed in order to share either the upper electrode 6 or the lower electrode 4 through the first to fourth ferroelectric capacitors C1 to C4 which are adjacent to each other. In the case in which a material of the upper electrode layer 6 is $SrRuO_3$, Ti is selected as the second insulating member 25. Ti is solid-state diffused so that the second insulating region 61 of $SrRu_xTi_{1-x}O_3$ is formed. In the case in which the material of the upper electrode layer 6 is Ru or $RuO_2$, moreover, Al, Ti or Cu is selected as the second insulating member 25. Al, Ti or Cu is solid-state diffused to carry out the RTO. Consequently, $Al_2O_3$, $TiO_x$ or $CuO_x$ is formed in the upper electrode 6 so that the second insulating region 61 is formed. In the case in which the material of the upper electrode layer 6 is $La_{1-x}Sr_xVO_3$, moreover, Sr is selected as the second insulating member 25. Sr is solid-state diffused so that the metal insulator transition is caused. Thus, the second insulating region 61 is formed.

(J) Then, a resist film 26 is applied onto the upper electrode 6 and is subjected to patterning by using the photolithographic technique. By using, as a mask, the resist film 26 thus patterned, an ion is implanted as shown in FIGS. 14A and 14B. As ion species, a heavy element such as germanium (Ge) or lead (Pb) is preferable. By an ion implanting energy, an element such as Ir of the material of the upper electrode layer 6 is knocked on into the ferroelectric film 5 so that a part of the ferroelectric film 5 is selectively transitioned from the insulator to the conductor (conducted). The residual resist film 26 is removed by using of the resist remover. As a result, as shown in FIGS. 15A and 15B, a second conductive region 51 for conducting the upper electrode layer 6 to the first conductive region 42 is formed. In the case in which the material of the ferroelectric film 5 is PZT, it is also possible to carry out a conduction by doping Pb to selectively reduce a resistance in a part of the ferroelectric film 5, for example.

(K) Thereafter, an interlayer insulating film 14 such as P-TEOS is formed on the hydrogen diffusion preventing film 7 by the CVD method. Next, a resist film is applied onto the interlayer insulating film 14 and is subjected to patterning by using the photolithographic technique. The resist film thus patterned is used as a mask to selectively remove a part of the hydrogen diffusion preventing film 7 and the interlayer insulating film 14 by the RIE so that a contact hole is formed. Subsequently, a metallic film 16 such as W is deposited by MOCVD, sputtering, plating or sputter reflow, and is flattened until an upper surface of the interlayer insulating film 14 is exposed by the CMP. As a result, the upper contact plug 16 is embedded in the contact hole as shown in FIGS. 16A and 16B.

(L) Then, a metallic film 15 such as W, Al, TiN, Cu, Ta or TaN is deposited on the upper contact plug 16 and the interlayer insulating film 14 by the vacuum deposition method or the sputtering method. A resist film is applied onto the metallic film 15 and is subjected to patterning by using the photolithographic technique. The resist film thus patterned is used as a mask to selectively remove a part of the metallic film by the RIE. Thus, the wiring 15 is formed as shown in FIG. 1.

In the conventional capacitor processing process, the lower electrode layer 4, the ferroelectric film 5 and the upper electrode layer 6 are deposited and sequentially processed by the RIE. However, it is generally hard to process the side surfaces of the upper electrode layer 6, the ferroelectric film 5 and the lower electrode layer 4 vertically. When the sidewalls of the first to fourth ferroelectric capacitors C1 to C4 approximate to be vertical, furthermore, the fences of the upper electrode 6 and the lower electrode 4 are easily deposited on the sidewall of the ferroelectric film 5 so that there is caused a problem in that the lower electrode 4 and the upper electrode 6 are short-circuited due to the fences. For this reason, in the capacitor processing using the RIE, a great converting difference is required so as not to form the fence. Therefore, a capacitor area cannot be increased. Moreover, there is also a problem in that the side surface of the ferroelectric film 5 is damaged by the RIE.

On the other hand, in the method for manufacturing the semiconductor memory according to the embodiment, the first to fourth ferroelectric capacitors C1 to C4 are separated from each other by transitioning each layer. That is, a part of the lower electrode 4 is insulated, a part of the ferroelectric film 5 is conducted, and a part of the upper electrode 6 is insulated, instead of sequentially processing the lower electrode layer 4, the ferroelectric film 5 and the upper electrode layer 6. Therefore, it is not necessary to take the converting difference of the RIE processing into consideration. As a result, a minuteness can be obtained more greatly and a larger capacitor area can be implemented for an equal cell size as compared with the case in which the sequential processing by the RIE is carried out. Since the necessary regions of each layer are selectively transitioned, it is not damaged by the RIE.

After the hydrogen diffusion preventing film is deposited, conventionally, the interlayer insulating film is deposited and flattened. Then, the contact plug for the upper electrode and the transistor is formed. The contact plug for the transistor is also formed between the ferroelectric capacitors which are sequentially processed. For this reason, it is necessary to take a contact plug diameter and an aligning margin into consideration. A cell size is determined from the converting difference in the RIE processing of the first to fourth ferroelectric capacitors C1 to C4, the contact plug diameter, and the aligning margin of the contact plug and the first to fourth ferroelectric capacitors C1 to C4, and a design is carried out to maximize the area of the capacitor while taking a consistency with these parameters. According to the method for manufacturing the semiconductor memory, the contact plug and the wiring around the cell are not required. Consequently, it is not necessary to take the aligning margin of the contact plug with the ferroelectric capacitor into consideration. A degree of freedom of the design can be enhanced and a reliability can also be improved.

When the first to fourth ferroelectric capacitors C1 to C4 are exposed to a hydrogen atmosphere, moreover, a characteristic is deteriorated. For this reason, the hydrogen diffusion preventing film 7 is deposited around the first to fourth ferroelectric capacitors C1 to C4 after a capacitor processing. When the minuteness is obtained, aspects of the first to fourth ferroelectric capacitors C1 to C4 sequentially processed by the RIE are increased. For this reason, it is hard to uniformly deposit the hydrogen diffusion preventing film 7. Accordingly, hydrogen in a back-end-of-line (BEOL) process enters the first to fourth ferroelectric capacitors C1 to C4 particularly from a portion having a poor coverage and causes a deterioration in the characteristic. According to the method for manufacturing the semiconductor memory in accordance with the embodiment, it is possible to reduce concavo-convex portions of the first to fourth ferroelectric capacitors C1 to C4. Therefore, it is possible to considerably improve the coverage of the hydrogen diffusion preventing film 7. Thus, it is possible to implement a large capacity ferroelectric memory having a high reliability.

(First Variant)

As a first variant of an embodiment, description will be given to another example of the method for manufacturing a semiconductor memory.

In the insulation of the lower electrode layer 4 described in the procedure shown in FIGS. 9A and 9B, the insulating species constituting the first insulating member 22 are not solid-state diffused but an ion of the insulating species may be implanted to form the first conductive region 42. In this case, for example, the lower electrode layer 4 is deposited on the interlayer insulating film 2 shown in FIGS. 6A and 6B and a non-implanting portion provided on the lower electrode layer 4 is masked with a resist film to implant an ion.

For example, in the case in which the lower electrode layer 4 is formed of Pt, Ir or $IrO_2$, an ion of Ti, Si or Al is implanted, and the RTO is carried out. Consequently, $TiO_2$, $SiO_2$ or $Al_2O_3$ is formed in the lower electrode layer 4 and a first insulating region 41 is formed. In the case in which the material of the lower electrode layer 4 is $SrRuO_3$, moreover, an ion of Ti is implanted into the lower electrode layer 4 so that the first insulating region 41 of $SrRu_xTi_{1-x}O_3$ is formed. In the case in which the material of the lower electrode layer 4 is Ru or $RuO_2$, furthermore, an ion of Al, Ti or Cu is implanted into the lower electrode layer 4 to carry out the RTO. Thus, $Al_2O_3$, $TiO_x$ or $CuO_x$ is formed. In addition, in the case in which the material of the lower electrode layer 4 is $La_{1-x}Sr_xVO_3$, an ion of Sr is implanted into the lower electrode layer 4. Thus, a metal insulator transition is caused so that the first insulating region 41 is formed.

In the procedure shown in FIG. 9, the insulating species constituting the first insulating member 22 embedded in the lower surface side of the lower electrode layer 4 are solid-state diffused. However, the first insulating member 22 may be disposed on an upper surface side of the lower electrode layer 4 to carry out a solid-state diffusion from the upper surface side.

In the insulation of the upper electrode layer 6 described in the procedure shown in FIG. 13, moreover, the insulating species of the second insulating member 25 are not solid-state diffused but an ion of the insulating species may be implanted to form a second insulating region 61. In this case, for example, the upper electrode layer 6 shown in FIG. 10 is deposited and a non-implanting portion of the upper electrode layer 6 is then masked with a resist film to implant an ion.

For example, in the case in which the upper electrode layer 6 is formed of Pt, Ir or $IrO_2$, a non-implanting portion of the upper electrode layer 6 is masked with a resist film and an ion of Ti, Si or Al is implanted. Consequently, $TiO_2$, $SiO_2$ or $Al_2O_3$ is formed and the second insulating region 61 is formed. In the case in which a material of the upper electrode layer 6 is $SrRuO_3$, moreover, an ion of Ti is implanted so that the second insulating region 61 of $SrRu_xTi_{1-x}O_3$ is formed. In the case in which the material of the upper electrode layer 6 is Ru or $RuO_2$, furthermore, an ion of Ti or Cu is implanted, and the RTO is carried out. Consequently, $Al_2O_3$, $TiO_x$ or $CuO_x$ is formed and the second insulating region 61 is formed. In addition, in the case in which the material of the upper electrode layer 6 is $La_{1-x}Sr_xVO_3$, an ion of Sr is implanted. Thus, the metal insulator transition is caused so that the second insulating region 61 is formed.

According to the first variant, in the case in which a part of the lower electrode layer 4 and the upper electrode layer 6 is insulated, it is also possible to implant an ion of the insulating species in place of the solid-state diffusion using the first insulating member 22 and the second insulating member 25.

(Second Variant)

Figure 17:
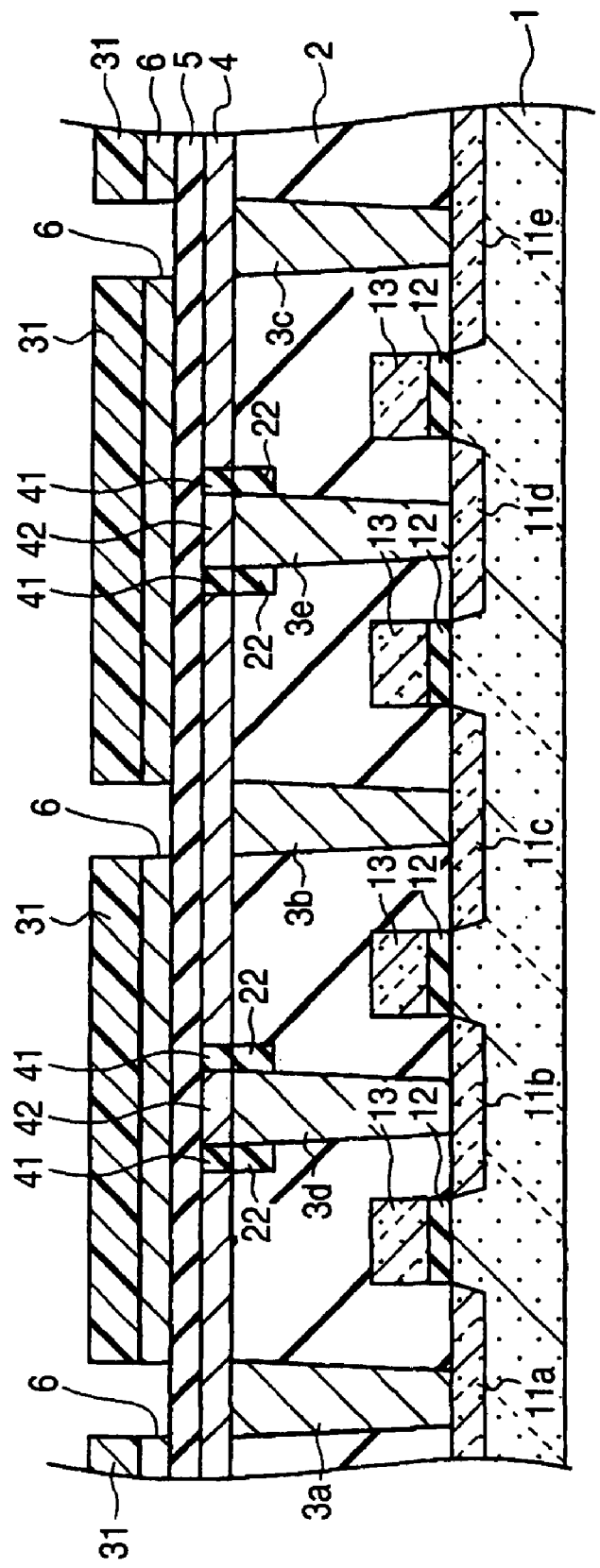
FIG. 17 is a sectional view showing a step, illustrating a method for manufacturing a semiconductor memory according to a second variant of the embodiment.

As a second variant of the embodiment, a further example of the method for manufacturing a semiconductor memory will be described with reference to FIGS. 17 and 18.

A ferroelectric film 5 and an upper electrode layer 6 are deposited on a lower electrode layer 4 in order through the serial procedure described with reference to FIGS. 6A to 9A, a resist film 31 is then applied onto the upper electrode layer 6, and a lithographic technique and an etching technique are used to pattern the resist film 31. The resist film 31 thus patterned is used as a mask to selectively remove a part of the upper electrode layer 6 as shown in FIG. 17 by an RIE method. The residual resist film 31 is removed by using of a resist remover.

Figure 18:
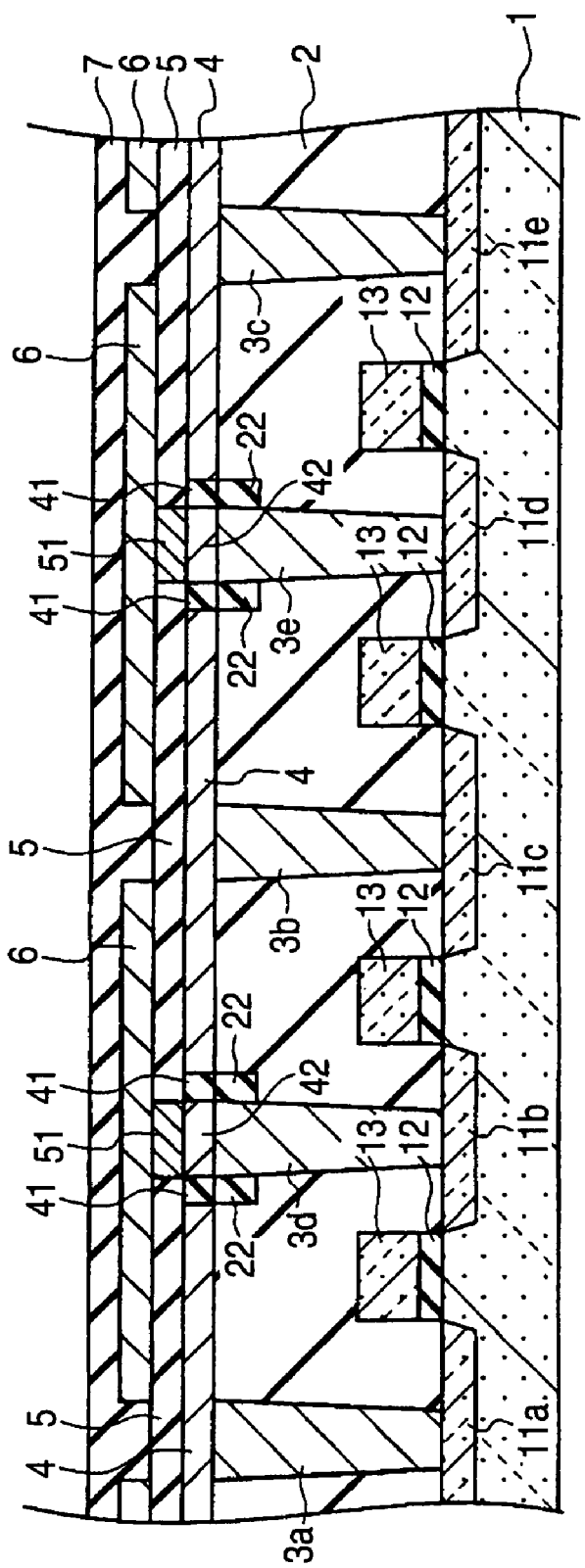
FIG. 18 is a sectional view showing a subsequent step to FIG. 17, illustrating the method for manufacturing a semiconductor memory according to the second variant of the embodiment.

Next, a hydrogen diffusion preventing film 7 is deposited on the upper electrode 6 as shown in FIG. 18 by a CVD method. Since a subsequent procedure is substantially the same as the serial procedure described with reference to FIGS. 14A to 16A, repetitive description will be omitted.

According to the method for manufacturing a semiconductor memory in accordance with the second variant, a part of the upper electrode layer 6 is not selectively insulated but a part of the upper electrode layer 6 may be processed by using the RIE method.

(Third Variant)

Figure 19:
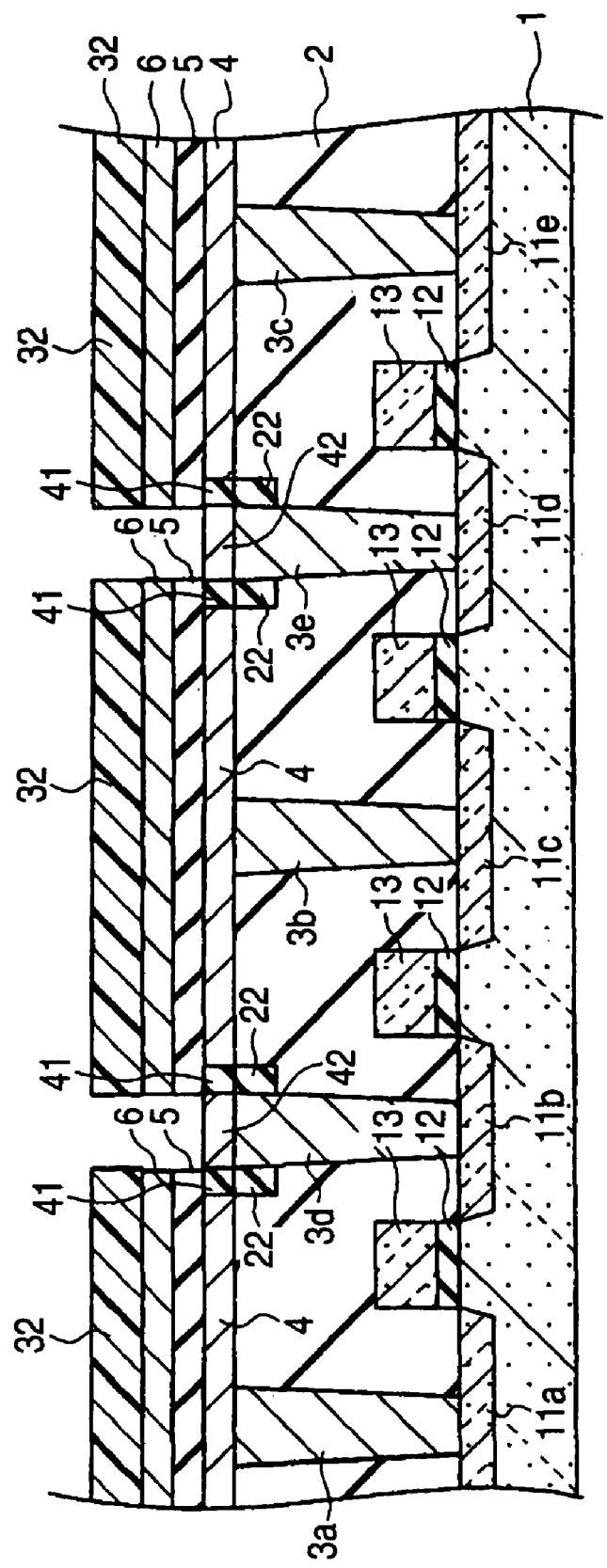
FIG. 19 is a sectional view showing a step, illustrating a method for manufacturing a semiconductor memory according to a third variant of the embodiment.
Figure 20:
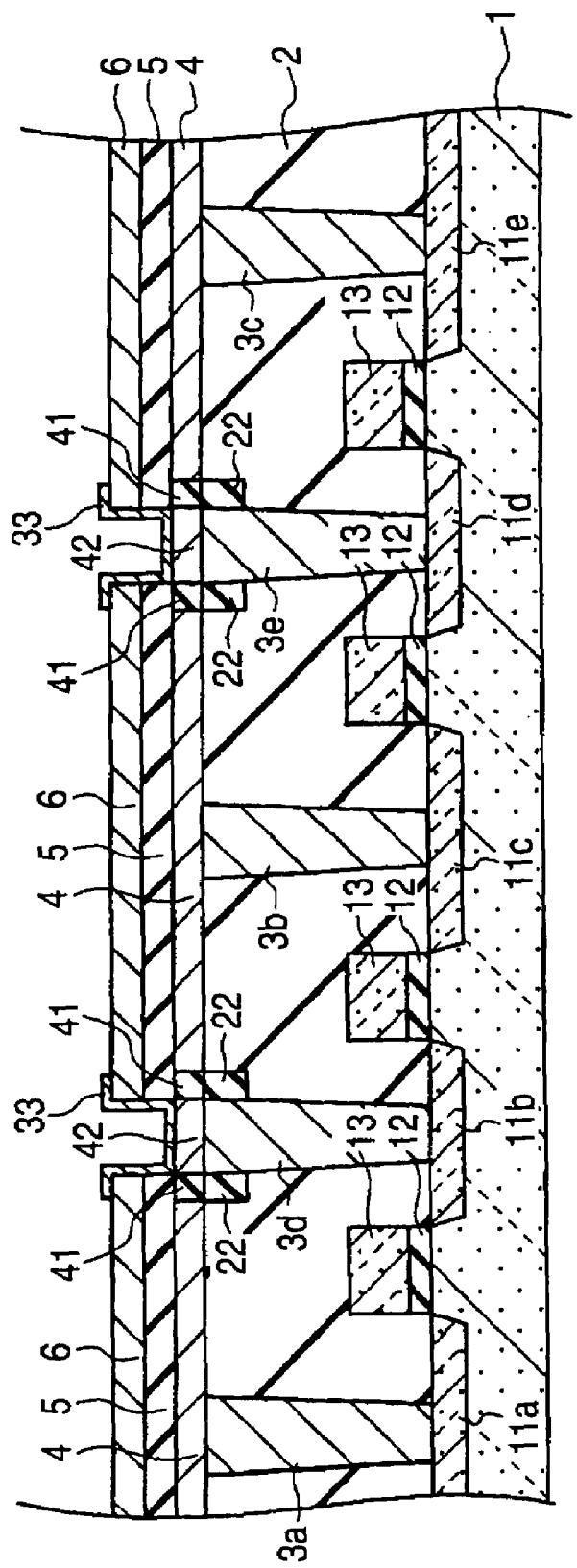
FIG. 20 is a sectional view showing a subsequent step to FIG. 19, illustrating the method for manufacturing a semiconductor memory according to the third variant of the embodiment.
Figure 21:
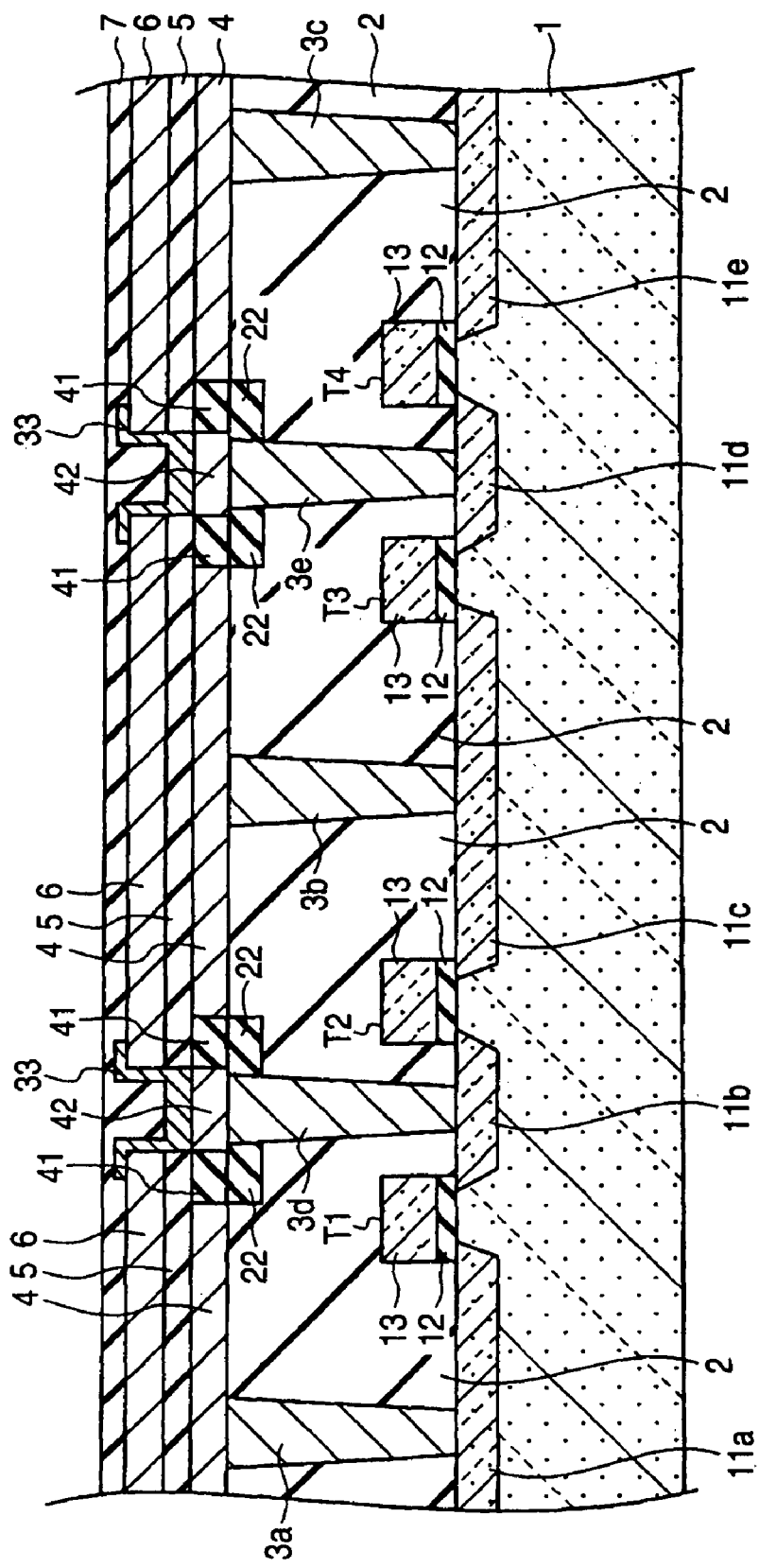
FIG. 21 is a sectional view showing a subsequent step to FIG. 20, illustrating the method for manufacturing a semiconductor memory according to the third variant of the embodiment.

As a third variant of the embodiment, a further example of the method for manufacturing a semiconductor memory will be described with reference to FIGS. 19 to 21.

A ferroelectric film 5 and an upper electrode layer 6 are deposited on a lower electrode layer 4 in order through the serial procedure described with reference to FIGS. 6A to 9A, a resist film 32 is then applied onto the upper electrode layer 6, and a lithographic technique and an etching technique are used to pattern the resist film 32. The resist film 32 thus patterned is used as a mask to selectively remove a part of the upper electrode layer 6 and the ferroelectric film 5 as shown in FIG. 19 by an RIE method.

Subsequently, a metallic film 33 is deposited. By using the lithographic technique and the etching technique, a part of the metallic film 33 is selectively removed so that the wiring 33 for connecting a first insulating region 41 to the upper electrode 6 is formed as shown in FIG. 20. As shown in FIG. 21, then, a hydrogen diffusion preventing film 7 is deposited on the wiring 33 and the upper electrode 6 by a CVD method. Since a subsequent procedure is substantially the same as the serial procedure described with reference to FIGS. 11A to 13A and FIG. 16A, repetitive description will be omitted.

According to the method for manufacturing a semiconductor memory in accordance with the third variant, a part of the ferroelectric film 5 is not selectively conducted but the ferroelectric film 5 may be processed by using the RIE method.

(Fourth Variant)

Figure 22:
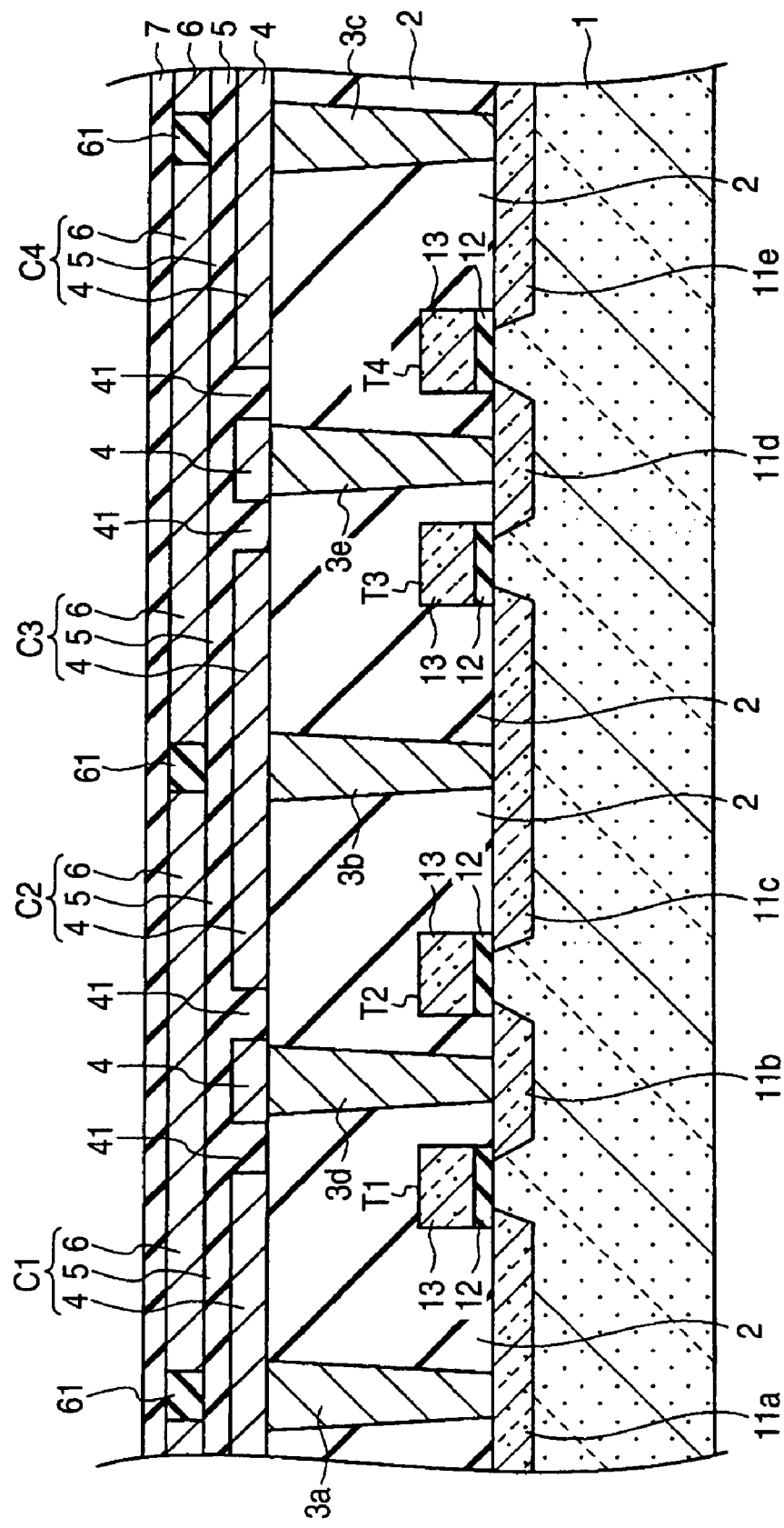
FIG. 22 is a sectional view showing a step, illustrating a method for manufacturing a semiconductor memory according to a fourth variant of the embodiment.

As a fourth variant of the embodiment, a further example of the method for manufacturing a semiconductor memory will be described with reference to FIG. 22.

A lower electrode layer 4 is deposited on an interlayer insulating film 2 through the serial procedure described with reference to FIG. 6A. A resist film is applied onto the lower electrode layer 4, and a lithographic technique and an etching technique are used to pattern the resist film. The resist film thus patterned is used as a mask to selectively remove a part of the lower electrode layer 4 by an RIE method. The residual resist film is removed by using of a resist remover. As shown in FIG. 22, then, a ferroelectric film 5, an upper electrode layer 6 and a hydrogen diffusion preventing film 7 are deposited in order. Since a subsequent procedure is substantially the same as the serial procedure described with reference to FIGS. 11A to 16A, repetitive description will be omitted.

According to the method for manufacturing a semiconductor memory in accordance with the fourth variant, a part of the lower electrode layer 4 is not selectively insulated but only the lower electrode layer 4 may be subjected to the RIE processing.

(Fifth Variant)

As a fifth variant of the embodiment, description will be given to an example of another structure of the semiconductor memory.

Figure 23:
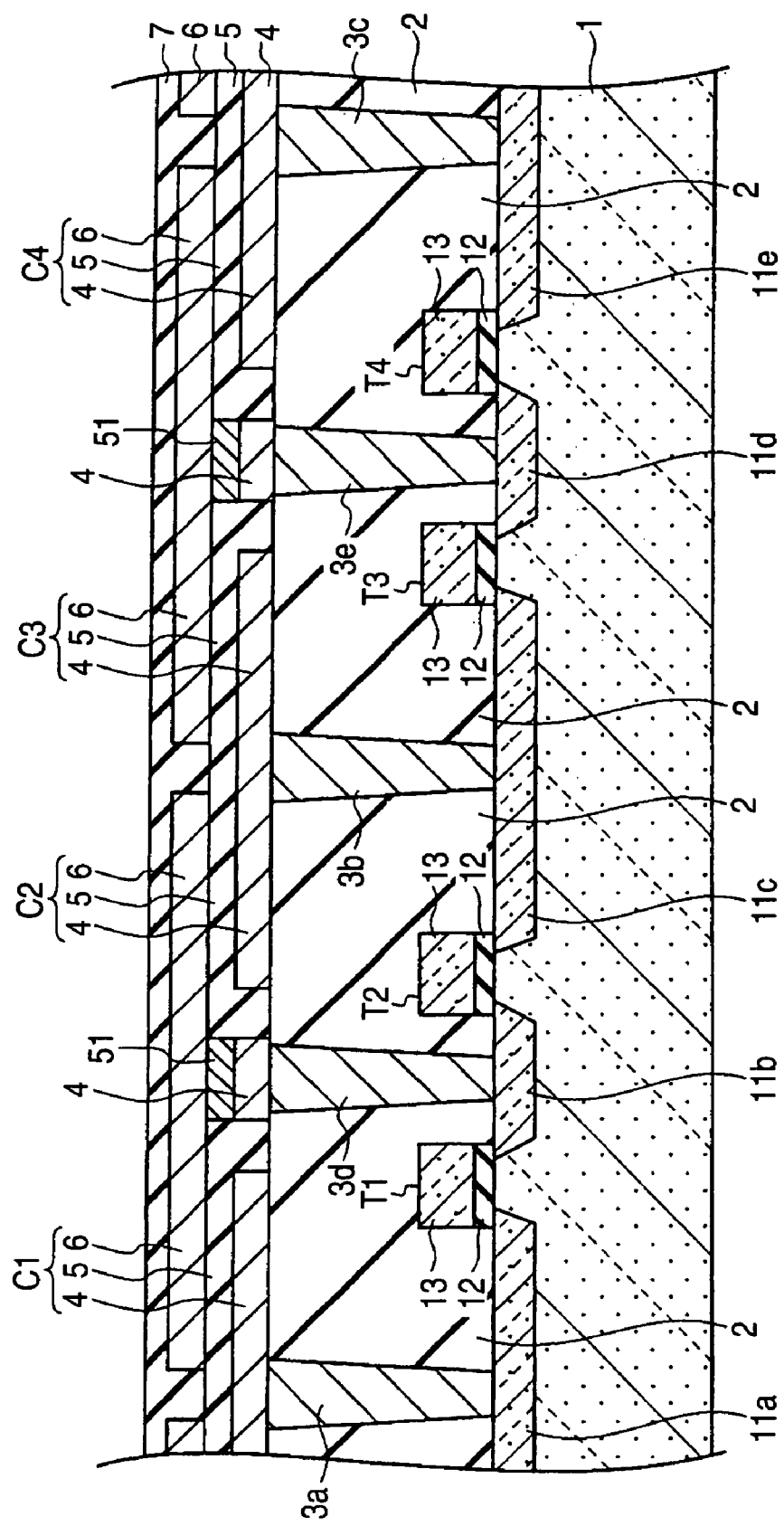
FIG. 23 is a sectional view showing an example of a semiconductor memory according to a fifth variant of the embodiment.

In the second to fourth variants of the embodiment, the description has been given to the example in which the lower electrode layer 4, the ferroelectric film 5 and the upper electrode layer 6 are subjected to the RIE processing, respectively. However, it is also possible to combine the RIE processings of the lower electrode layer 4, the ferroelectric film 5 and the upper electrode layer 6. For example, as shown in FIG. 23, the lower electrode layer 4 may be subjected to the RIE processing, the upper electrode layer 6 may be subjected to the RIE processing and a part of the ferroelectric film 5 may be conducted.

Figure 24:
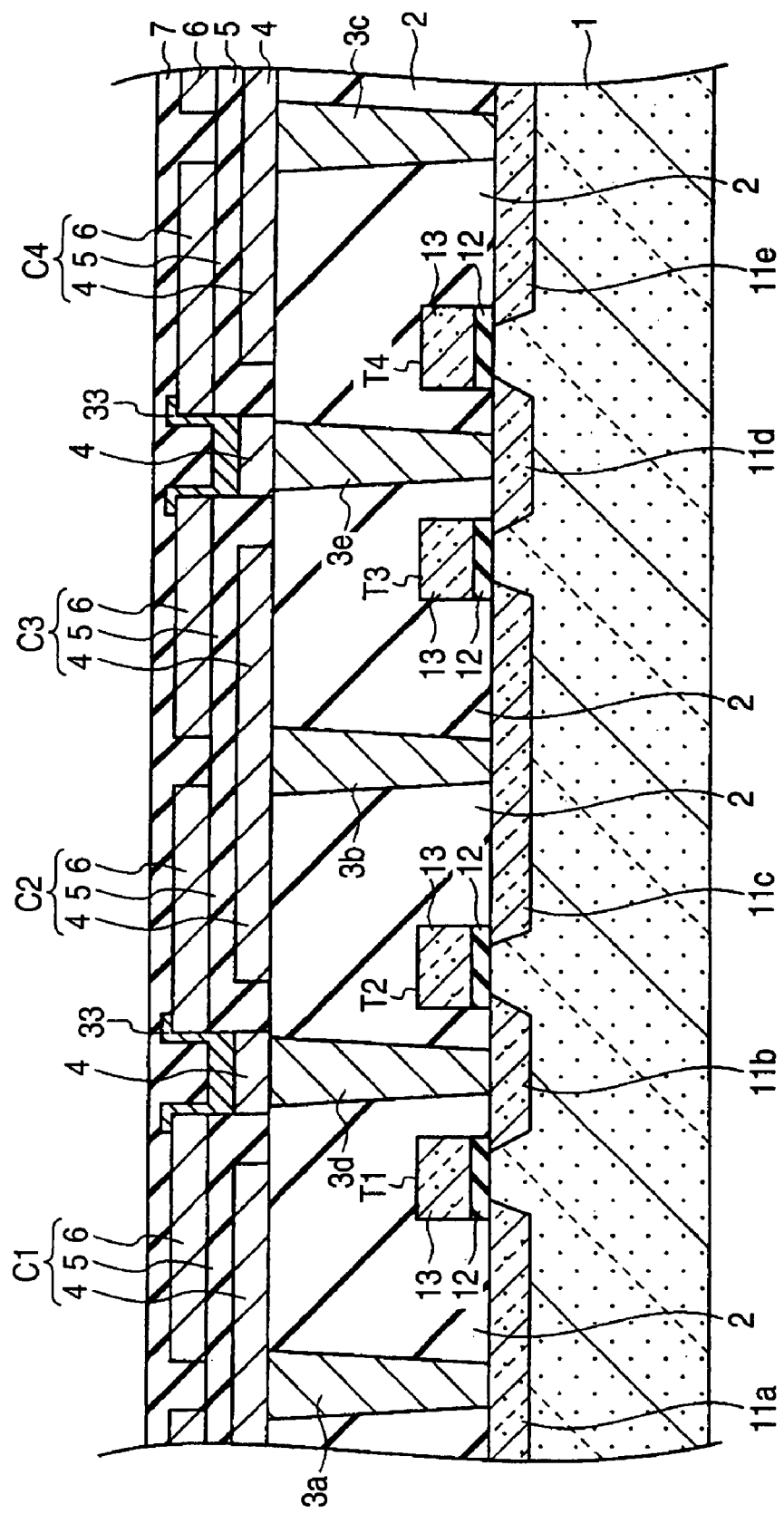
FIG. 24 is a sectional view showing another example of the semiconductor memory according to the fifth variant of the embodiment.

As shown in FIG. 24, moreover, the lower electrode layer 4, the ferroelectric film 5 and the upper electrode layer 6 may be subjected to the RIE processing, respectively. Since the sequential processing by the RIE is not carried out, an RIE converting difference does not need to be taken into consideration.

(Sixth Variant)

As a sixth variant of the embodiment, an example of a further structure of the semiconductor memory will be described with reference to FIG. 25.

Figure 25:
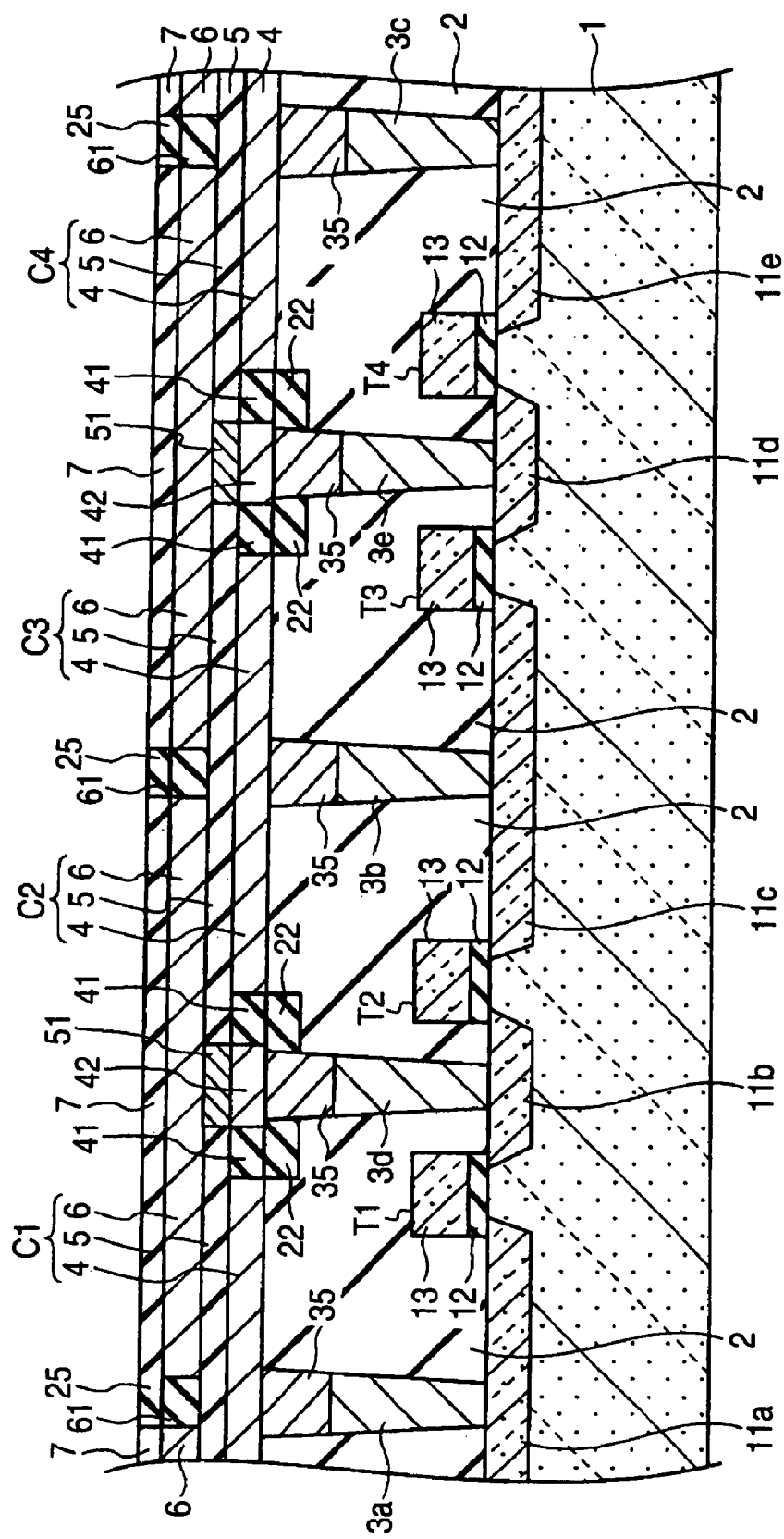
FIG. 25 is a sectional view showing an example of a semiconductor memory according to a sixth variant of the embodiment.

A semiconductor memory according to the sixth variant is different from the semiconductor memory shown in FIG. 1 in that an oxygen barrier film 35 is embedded between first to fifth contact plugs 3a to 3e and a lower electrode 4 as shown in FIG. 25. As a material of the oxygen barrier film 35, it is possible to use Ti and TiAlN. Since the other structures are substantially the same as those of the semiconductor memory shown in FIG. 1, repetitive description will be omitted. According to the semiconductor memory in accordance with the variant, the oxygen barrier film 35 can be thinner.

In a method for manufacturing the semiconductor memory according to the sixth variant of the embodiment, it is preferable that the first to fifth contact plugs 3a to 3e should be embedded up to a middle of a contact hole through the serial procedure described with reference to FIGS. 6A to 8A, and the oxygen barrier film 35 should be embedded in the first to fifth contact plugs 3a to 3e by a CVD method. Since a subsequent procedure is substantially the same as the serial procedure described with reference to FIGS. 9A to 16A, repetitive description will be omitted. According to the method for manufacturing the semiconductor memory in accordance with the variant, the oxygen barrier film 35 can be thinner. Therefore, the process, such as the insulation process or the etching process can easily be carried out.

(Seventh Variant)

As a seventh variant of the embodiment, an example of a further structure of the semiconductor memory will be described with reference to FIG. 26.

Figure 26:
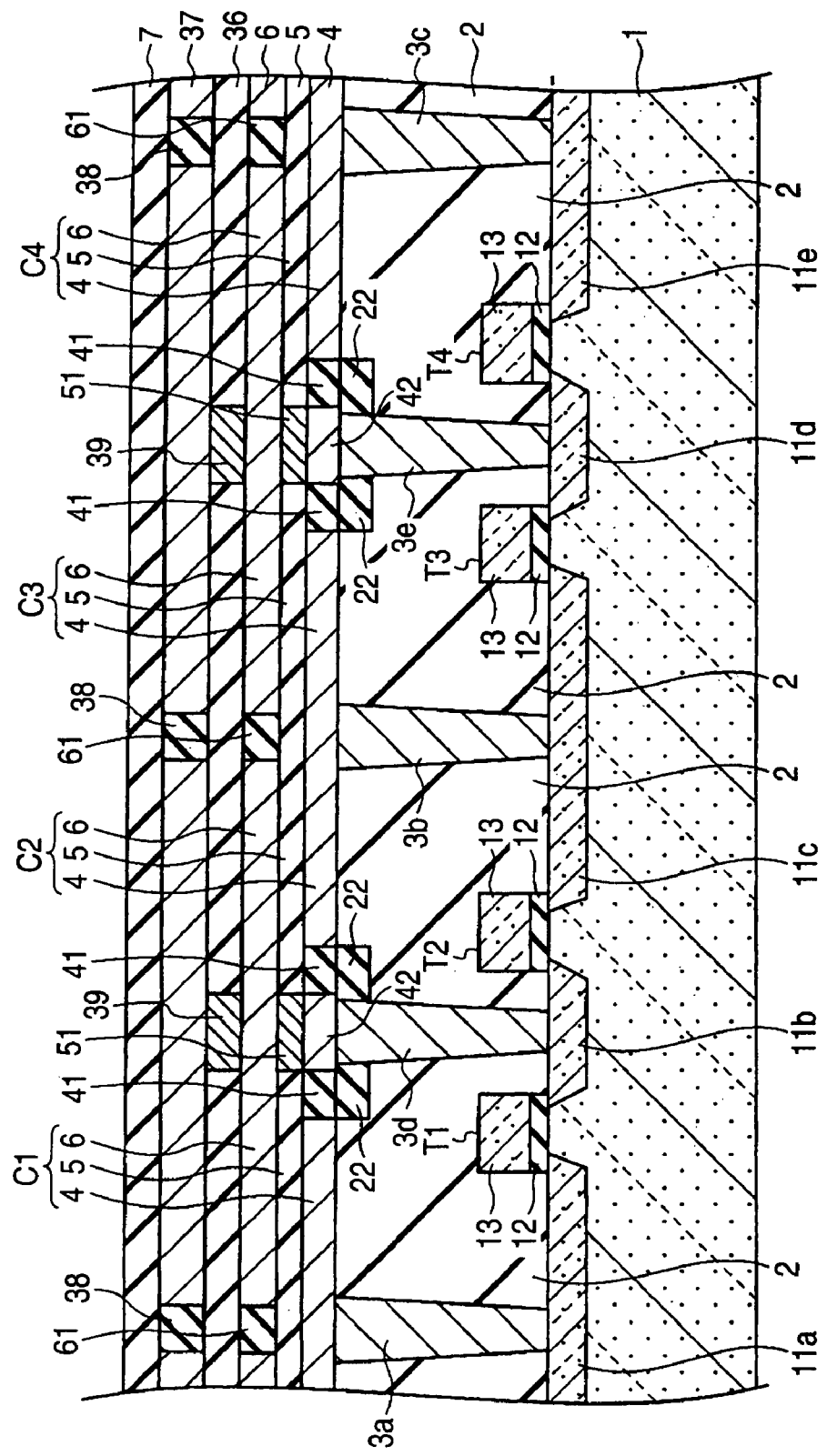
FIG. 26 is a sectional view showing an example of a semiconductor memory according to a seventh variant of the embodiment.

The semiconductor memory according to the seventh variant is different from the semiconductor memory shown in FIG. 1 in that each of first to fourth ferroelectric capacitors C1 to C4 further includes an additional ferroelectric film 36 and an additional upper electrode 37 which are provided on an upper electrode 6 as shown in FIG. 26. Since the other structures are substantially the same as those of the semiconductor memory shown in FIG. 1, repetitive description will be omitted.

According to the semiconductor memory in accordance with the variant of the embodiment, the additional ferroelectric film 36 and the additional upper electrode 37 are provided on the upper electrode 6. Therefore, it is possible to increase an effective capacitor area. Therefore, it is possible to implement a ferroelectric memory having a higher reliability.

In a method for manufacturing the semiconductor memory according to the seventh variant of the embodiment, through the serial procedure described with reference to FIGS. 6A to 15A, the additional ferroelectric film 36 and the additional upper electrode layer 37 are deposited in order, a part of the additional upper electrode layer 37 is insulated to form a third insulating region 38, and apart of the additional ferroelectric film 36 is conducted to form a third conductive region 39. Since a subsequent procedure is substantially the same as the serial procedure described with reference to FIG. 16A, repetitive description will be omitted.

(Eighth Variant)

As an eighth variant of the embodiment, a peripheral circuit region of the semiconductor memory will be described with reference to FIG. 27.

Figure 27:
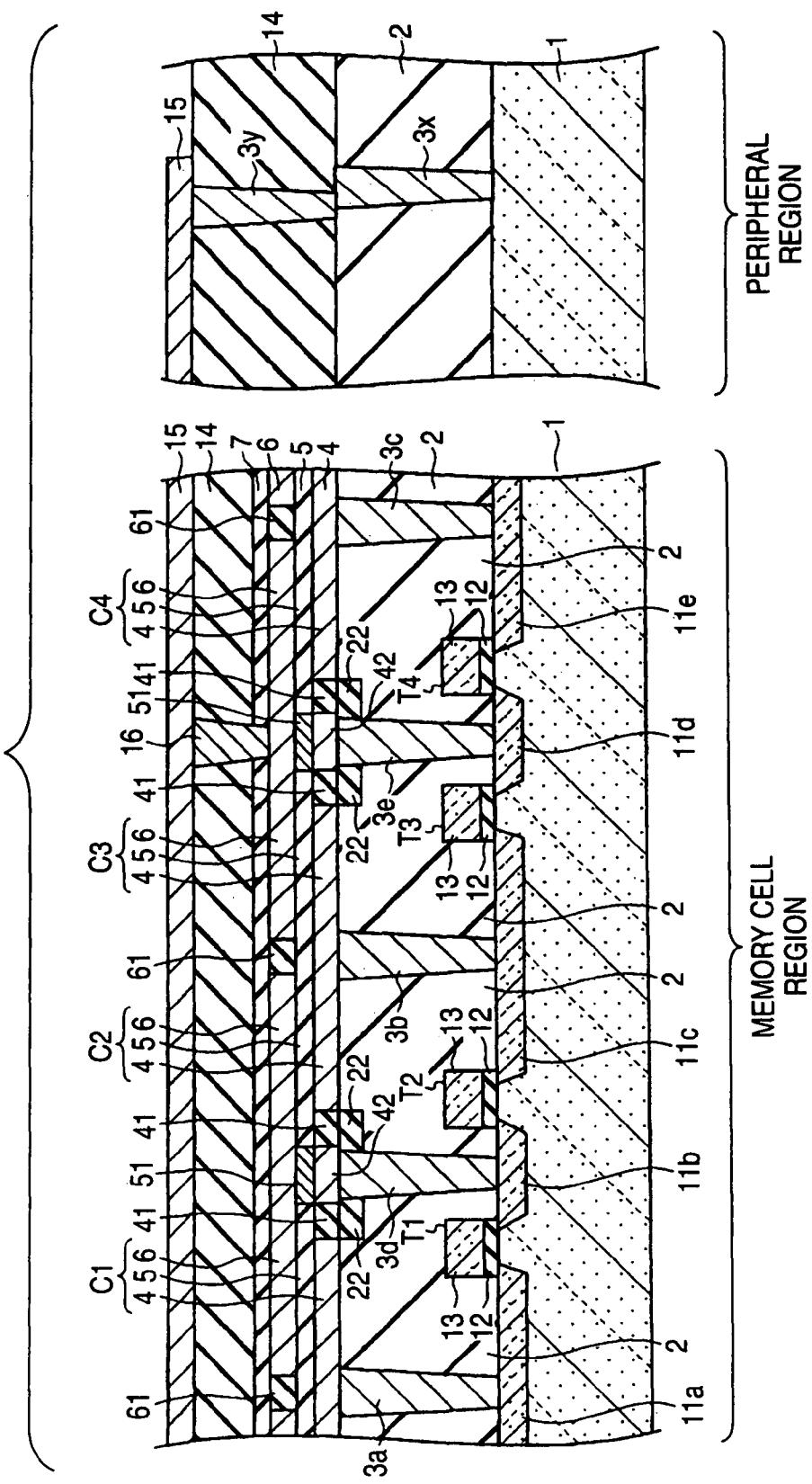
FIG. 27 is a sectional view showing an example of a semiconductor memory according to an eighth variant of the embodiment.

As shown in FIG. 27, in the peripheral circuit, a lower electrode 4, a ferroelectric film 5 and an upper electrode 6 are not provided. For example, interlayer insulating films 2 and 14 are disposed on a semiconductor substrate 1, and contact plugs 3x and 3y for connecting the semiconductor substrate 1 to a wiring 15 are formed to penetrate through the interlayer insulating films 2 and 14.

In a method for manufacturing the semiconductor memory according to the eighth variant of the embodiment, it is preferable that a memory cell region should be masked, and the lower electrode 4, the ferroelectric film 5 and the upper electrode 6 which are formed in the peripheral circuit region are selectively removed by RIE. Since a larger peripheral region is subjected to the RIE processing as compared with the memory cell region, it is damaged with more difficulties. Furthermore, the ferroelectric film 5 is not present in the peripheral region. Therefore, a consistency with a logic process is excellent.

Other Embodiments

While the invention has been described above based on the embodiment, it is to be understood that the statements and drawings constituting a part of the disclosure do not restrict the invention. From the disclosure, various alternative embodiments, examples and application techniques are apparent to the skilled in the art.

Figure 28:
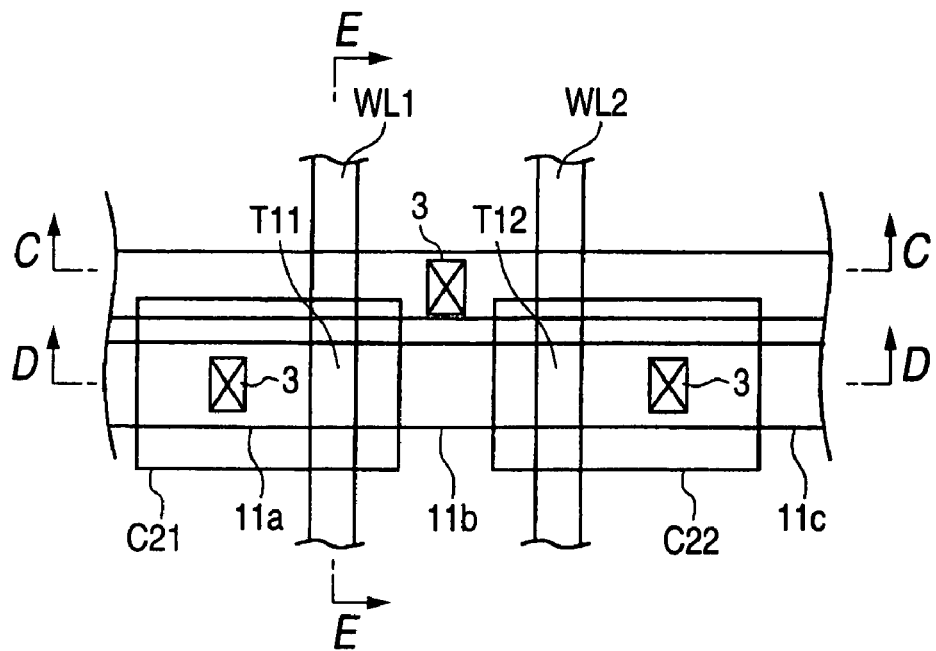
FIG. 28 is a plan view showing an example of a semiconductor memory according to a further embodiment.
Figure 29:
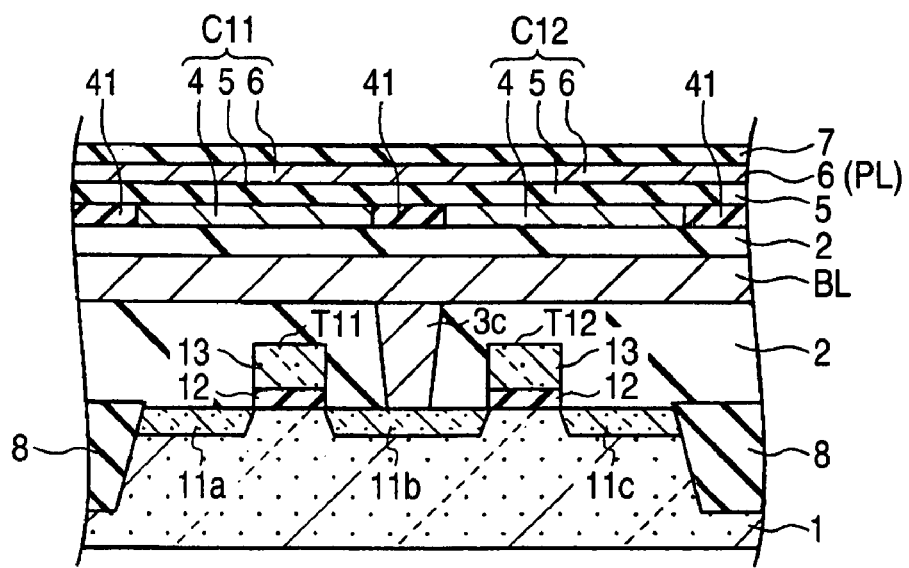
FIG. 29 is a sectional view in a direction of a bit line showing the example of the semiconductor memory according to the further embodiment.
Figure 30:
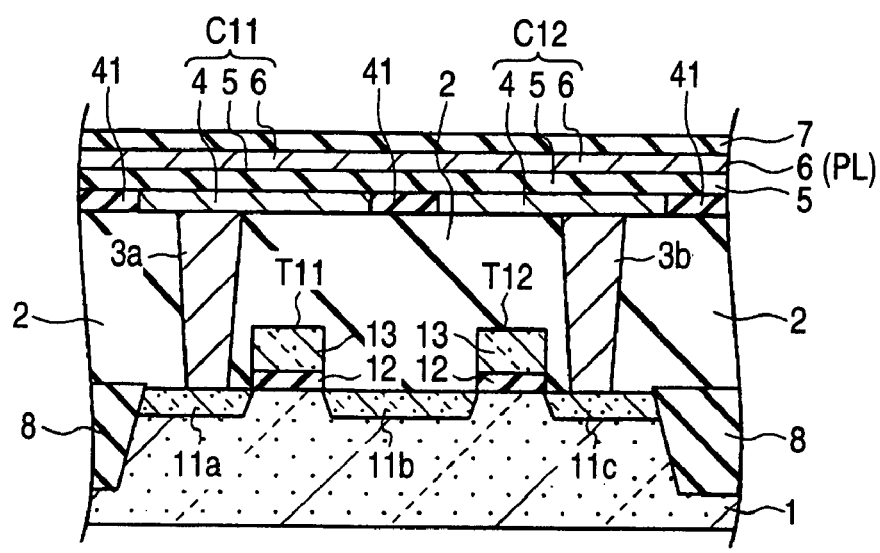
FIG. 30 is a sectional view in the direction of the bit line showing the example of the semiconductor memory according to the further embodiment.
Figure 31:
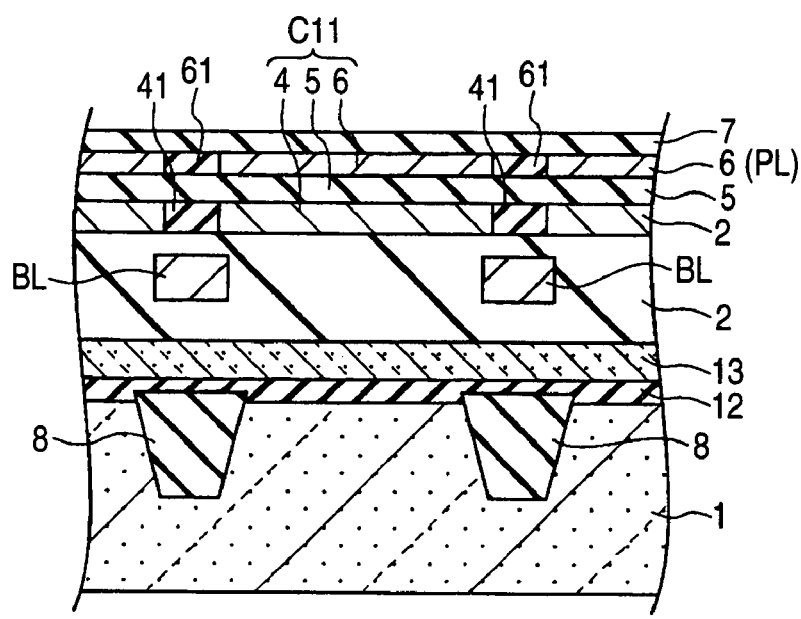
FIG. 31 is a sectional view in a direction of a word line of the semiconductor memory according to the further embodiment.
Figure 32:
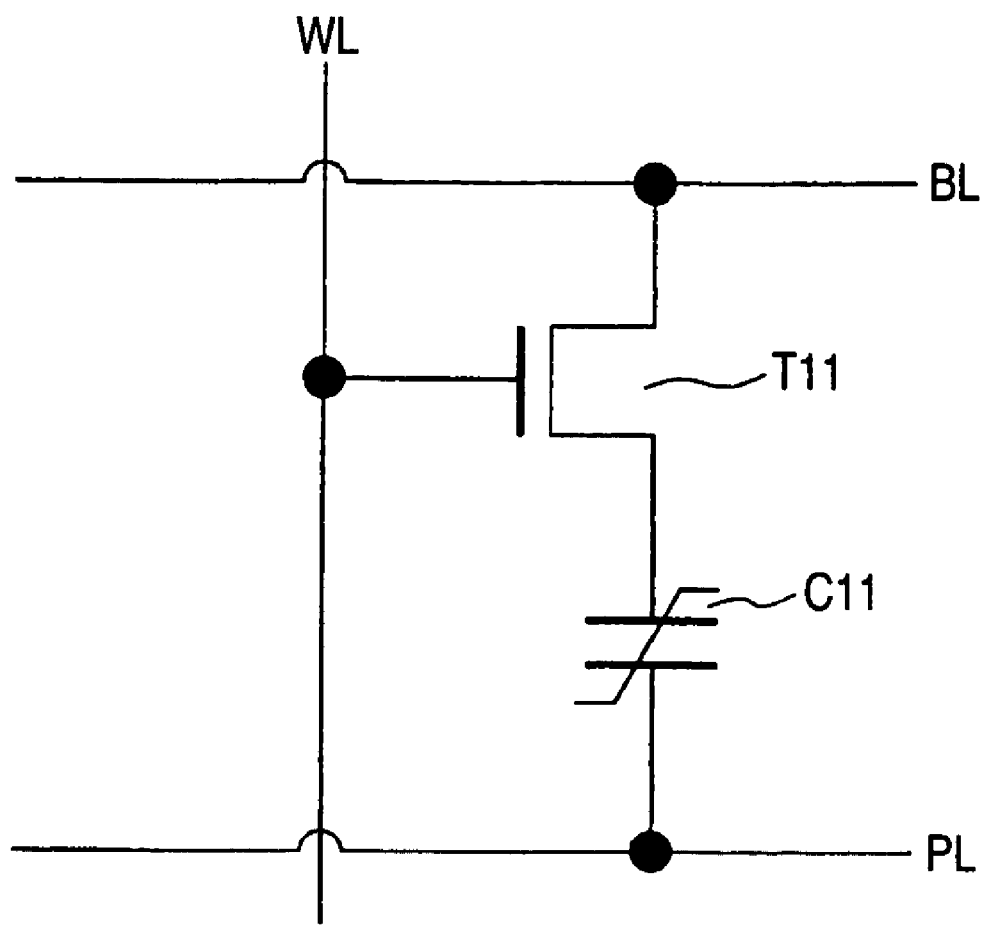
FIG. 32 is a circuit diagram showing an example of a memory cell of the semiconductor memory according to the further embodiment.

Although the TC parallel unit series connection type ferroelectric memory has been described as the semiconductor memory according to the embodiment, for example, this is not particularly restricted. With reference to FIGS. 28 to 32, a COB (Capacitor Over Bitline) type ferroelectric memory will be described as a semiconductor memory according to a further embodiment. FIG. 28 is a plan view showing a part of the COB type ferroelectric memory. Sectional structures seen on a C-C cut surface, a D-D cut surface and an E-E cut surface respectively correspond to FIGS. 29 to 31. As shown in FIG. 29, a bit line BL is extended and disposed in an interlayer insulating film 2. A third contact plug 3c connects a source and drain region 11b to the bit line BL. Ferroelectric capacitors C11 and C12 include a lower electrode 4, a ferroelectric film 5 and an upper electrode 6. The upper electrode 6 acts as a plate line PL. As shown in FIG. 30, a first contact plug 3a connects a source and drain region 11a to the lower electrode 4 of the ferroelectric capacitor C11. A second contact plug 3b connects a source and drain region 11c to the lower electrode 4 of the ferroelectric capacitor C12. As shown in FIG. 31, an element isolation is carried out through an STI region 8. As shown in FIG. 32, a gate of a first transistor T11 is connected to a word line WL1. The first transistor T11 has one of ends connected to the bit line BL and the other end connected to one of ends of the ferroelectric capacitor C11. The other end of the ferroelectric capacitor C11 is connected to the plate line PL.

According to the semiconductor memory in accordance with the embodiment, also in the COB type ferroelectric memory, the ferroelectric capacitors C11 and C12 share the upper electrode 6 in the same manner as in the case of the TC parallel unit series connection type ferroelectric memory. Therefore, areas of the ferroelectric capacitors C11 and C12 are increased, and the number of the contact plugs is reduced.

Thus, it is a matter of course that the invention include various embodiments which have not been described above. Accordingly, the technical range of the invention is defined by only the specific matters of the invention related to proper claims from the description.

As described above, there is provided a semiconductor memory capable of increasing an area of a ferroelectric capacitor and a method for manufacturing the semiconductor memory.

What is claimed is:

1. A semiconductor memory comprising:
    a lower electrode;
    a first insulating region that is formed in the same layer as the lower electrode and that partitions the lower electrode;
    a ferroelectric film that is formed on the lower electrode and on the first insulating region;
    an upper electrode formed on the ferroelectric film;
    a second insulating region that is formed in the same layer as the upper electrode and that partitions the upper electrode; and
    a transistor comprising:
        a first impurity region connected to the lower electrode,
        a second impurity region connected to the upper electrode, and
        a channel region disposed between the first impurity region and the second impurity region;
    wherein at least one of the first insulating region and the second insulating region is formed by insulating the lower electrode or the upper electrode,
    wherein the lower electrode includes at least one material selected from a group consisting of Pt, Ir, $IrO_2$, $SrRuO_3$, Ru, $RuO_2$, and $La_{1-x}Sr_xVO_3$ (X<0.2), and
    wherein the first insulating region comprises the material of the lower electrode and an insulating species.

2. The semiconductor memory according to claim 1, wherein the second insulating region comprises a constituting element of the upper electrode and an insulating species.

3. The semiconductor memory according to claim 1 further comprising:
    a first conducting region that is connected to the second impurity region and formed in the first insulating region; and
    a second conducting region that is formed in the ferroelectric film and that electrically connects the first conducting region and the upper electrode.

4. The semiconductor memory according to claim 1, wherein the second conducting region comprises a constituting element of the ferroelectric film and a constituting element of the upper electrode.

5. The semiconductor memory according to claim 1, wherein the upper electrode comprises a pair of the upper electrodes;
    wherein the pair of the upper electrodes respectively forms ferroelectric capacitors with the lower electrode.

6. The semiconductor memory according to claim 1, wherein a capacitor formed by the lower electrode, the ferroelectric film, and the upper electrode comprises a plurality of ferroelectric capacitors adjacent to each other, and
    wherein one of the ferroelectric capacitors shares at least one of the lower electrode and the upper electrode with the adjacent ferroelectric capacitor.

7. The semiconductor memory according to claim 1 further comprising:
    a first oxygen barrier film that is disposed between the first impurity region and the lower electrode; and
    a second oxygen barrier film that is disposed between the second impurity region and the first conducting region.

8. The semiconductor memory according to claim 1 further comprising:
    an additional ferroelectric film that is formed on the upper electrode; and an additional upper electrode that is formed on the additional ferroelectric film.

9. A semiconductor memory according to claim 1, comprising:
a lower electrode;
a first insulating region that is formed in the same layer as the lower electrode and that partitions the lower electrode;
a ferroelectric film that is formed on the lower electrode and on the first insulating region;
an upper electrode formed on the ferroelectric film;
a second insulating region that is formed in the same layer as the upper electrode and that partitions the upper electrode; and
a transistor comprising:
a first impurity region connected to the lower electrode,
a second impurity region connected to the upper electrode, and
a channel region disposed between the first impurity region and the second impurity region;
wherein at least one of the first insulating region and the second insulating region is formed by insulating the lower electrode or the upper electrode,
wherein the upper electrode includes at least one material selected from a group consisting of Pt, Ir, $IrO_2$, $SrRuO_3$, Ru, $RuO_2$, and $La_{1-x}Sr_xVO_3$ (X<0.2), and
wherein the second insulating region comprises the material of the upper electrode and an insulating species.

10. A semiconductor memory comprising:
a lower electrode layer having a first conductive region and a first insulating region partitioning the lower electrode layer;
a ferroelectric film formed on the lower electrode layer;
an upper electrode layer formed on the ferroelectric film, the upper electrode layer having a conductive region and a second insulating region partitioning the upper electrode layer;
an insulating member formed beneath at least one of the first insulating region and the second insulating region; and
a transistor comprising:
a first impurity region connected to the first conductive region,
a second impurity region connected to the second conductive region, and
a channel region disposed between the first impurity region and the second impurity region,
wherein the lower electrode includes at least one material selected from a group consisting of Pt, Ir, $IrO_2$, $SrRuO_3$, Ru, $RuO_2$, and $La_{1-x}Sr_xVO_3$ (X<0.2), and
wherein the first insulating region comprises the material of the lower electrode and an insulating species.

* * * * *

UNITED STATES PATENT AND TRADEMARK OFFICE
CERTIFICATE OF CORRECTION

| | | |
|---|---|---|
| PATENT NO. | : 7,763,920 B2 | Page 1 of 1 |
| APPLICATION NO. | : 11/898297 | |
| DATED | : July 27, 2010 | |
| INVENTOR(S) | : Kumura et al. | |

It is certified that error appears in the above-identified patent and that said Letters Patent is hereby corrected as shown below:

Claim 9, column 17, line 3, change "memory according to claim 1," to --memory,--.

Signed and Sealed this

Sixteenth Day of November, 2010

David J. Kappos
*Director of the United States Patent and Trademark Office*